(12) United States Patent
Kuwajima et al.

(10) Patent No.: US 10,355,161 B2
(45) Date of Patent: Jul. 16, 2019

(54) GERMANIUM-BASED PHOTORECEIVER HAVING TUNGSTEN CONTACTS

(71) Applicant: RENESAS ELECTRONICS CORPORATION, Tokyo (JP)

(72) Inventors: Teruhiro Kuwajima, Ibaraki (JP); Shinichi Watanuki, Ibaraki (JP); Futoshi Komatsu, Ibaraki (JP); Tomoo Nakayama, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/703,525

(22) Filed: Sep. 13, 2017

(65) Prior Publication Data

US 2018/0083154 A1    Mar. 22, 2018

(30) Foreign Application Priority Data

Sep. 20, 2016    (JP) ................................ 2016-182523

(51) Int. Cl.
| | |
|---|---|
| *H01L 31/18* | (2006.01) |
| *H01L 31/028* | (2006.01) |
| *H01L 31/105* | (2006.01) |
| *H01L 31/0224* | (2006.01) |

(52) U.S. Cl.
CPC .......... *H01L 31/105* (2013.01); *H01L 31/028* (2013.01); *H01L 31/022408* (2013.01); *H01L 31/1804* (2013.01); *H01L 31/1808* (2013.01); *Y02E 10/547* (2013.01); *Y02P 70/521* (2015.11)

(58) Field of Classification Search
CPC . H01L 31/105; H01L 31/1808; H01L 31/028; H01L 31/0288; H01L 31/022408; H01L 31/02005; H01L 31/1804–1816; H01L 31/08–119; H01L 23/53266; H01L 21/76843–76849
USPC ........................................................ 257/458
See application file for complete search history.

(56) References Cited

U.S. PATENT DOCUMENTS

| | | | |
|---|---|---|---|
| 2002/0050649 A1* | 5/2002 | Ahn ................... | H01L 23/53238 257/773 |
| 2013/0202005 A1* | 8/2013 | Dutt ....................... | H01L 29/165 372/50.1 |
| 2014/0027826 A1* | 1/2014 | Assefa .................... | H01L 35/34 257/290 |

(Continued)

FOREIGN PATENT DOCUMENTS

JP           3239596 B2    12/2001

*Primary Examiner* — Marc Anthony Armand
*Assistant Examiner* — Younes Boulghassoul
(74) *Attorney, Agent, or Firm* — McDermott Will & Emery LLP

(57) ABSTRACT

To achieve a high-reliability germanium photoreceiver. A photoreceiver portion of a germanium photoreceiver comprised of a p type silicon core layer, an i type germanium layer, and an n type silicon layer is covered with a second insulating film and from a coupling hole formed in the second insulating film, a portion of the upper surface of the photoreceiver portion is exposed. The coupling hole has, on the inner wall thereof, a barrier metal film and the barrier metal film has thereon a first-layer wiring made of a tungsten film. Tungsten hardly diffuses from the tungsten film into the i type germanium layer even when a thermal stress is applied, making it possible to prevent the resulting germanium photoreceiver from having diode characteristics deteriorated by the thermal stress.

18 Claims, 17 Drawing Sheets

(56) References Cited

U.S. PATENT DOCUMENTS

| | | | |
|---|---|---|---|
| 2016/0141243 A1* | 5/2016 | You | H01L 23/5226 257/369 |
| 2016/0148959 A1* | 5/2016 | Cheng | H01L 21/77 257/290 |
| 2016/0197111 A1* | 7/2016 | Coolbaugh | H01L 27/14625 257/432 |
| 2017/0012143 A1* | 1/2017 | Usami | H01L 31/0288 |
| 2017/0025562 A1* | 1/2017 | Knoll | G02B 6/42 |
| 2017/0062508 A1* | 3/2017 | Na | H01L 27/1443 |
| 2017/0271529 A1* | 9/2017 | Tan | H01L 31/024 |
| 2017/0317221 A1* | 11/2017 | Usami | G02B 6/12004 |
| 2018/0138325 A1* | 5/2018 | Watanuki | H01L 31/02161 |

\* cited by examiner

GERMANIUM-BASED PHOTORECEIVER HAVING TUNGSTEN CONTACTS

CROSS-REFERENCE TO RELATED APPLICATIONS

The disclosure of Japanese Patent Application No. 2016-182523 filed on Sep. 20, 2016 including the specification, drawings, and abstract is incorporated herein by reference in its entirety.

BACKGROUND

The present invention relates to a semiconductor device and is suited for use, for example, in a semiconductor device having therein a germanium photoreceiver (photodetector).

Japanese Patent No. 3239596 (Patent Document 1) describes a GaAs/Si composite integrated circuit having a contact hole in an $Si_3N_4$ layer serving as a protector of a GaAs operation layer, an Au—Ge alloy layer which is an ohmic electrode material for GaAs at the bottom portion, and an Au layer on this alloy layer and having, as a barrier layer, a conductor material such as Mo, which is inert to Au or Al at about 450° C., inserted between the Al wiring and the Au layer.

[Patent Document 1] Japanese Patent No. 3239596

SUMMARY

In the silicon photonics technology, a photoreceiver is indispensable for fusing an optical circuit with an electronic circuit and a germanium photoreceiver making use of a germanium semiconductor is regarded promising. A germanium photoreceiver using an aluminum wiring has however such a problem that it does not exhibit diode characteristics as a result of interdiffusion and reaction between aluminum and germanium due to a thermal stress applied in a post step, for example, at from 350° C. to 400° C. for about from 30 minutes to 2 hours.

Another problem and novel features will be apparent from the description herein and accompanying drawings.

A semiconductor device according to one embodiment is equipped with a germanium photoreceiver comprised of a photoreceiver portion having a germanium layer and the photoreceiver portion is covered with a clad layer. The clad layer has therein a coupling hole reaching the upper surface of the photoreceiver portion; the coupling hole has, on the inner wall thereof, a barrier metal film; and the barrier metal film has thereon a first-layer wiring made of a tungsten film.

According to the one embodiment, a high-reliability germanium photoreceiver can be achieved.

DETAILED DESCRIPTION

Figure 1:
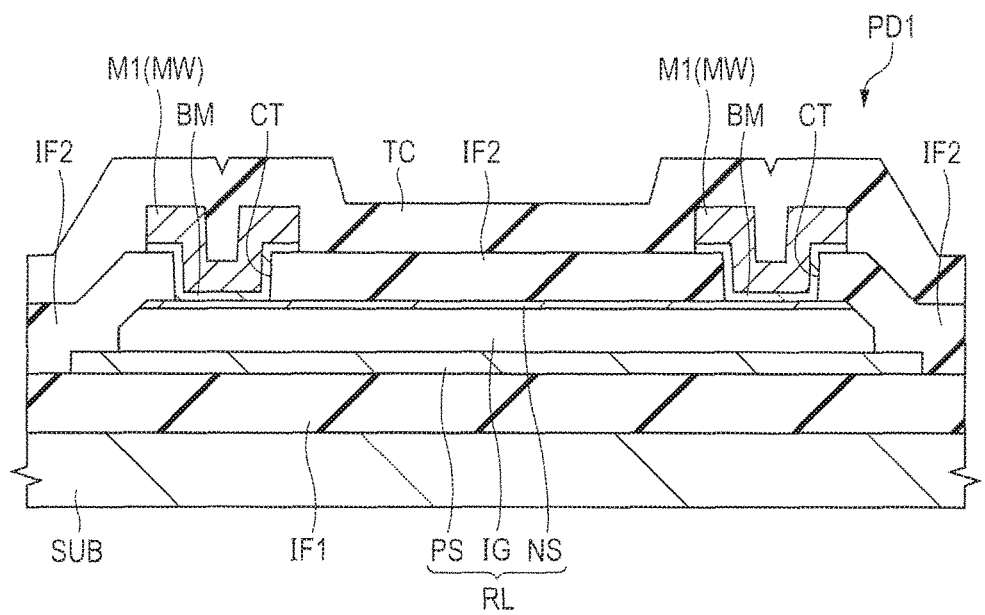
FIG. 1 is a fragmentary cross-sectional view of a germanium photoreceiver of First Embodiment.

In the below-described embodiments, a description will be made after divided in a plurality of sections or embodiments if necessary for convenience sake. These sections or embodiments are not independent from each other, but in a relation such that one is a modification example, details, complementary description, or the like of a part or whole of the other one unless otherwise specifically indicated.

In the below-described embodiments, when a reference is made to the number or the like of components (including the number, value, amount, range, or the like of components), the number of components is not limited to a specific number but may be greater than or less than the specific number unless otherwise specifically indicated or principally apparent that the number is limited to the specific number.

Moreover, in the below-described embodiment, it is needless to say that the constituent components (including component steps) are not always essential unless otherwise specifically indicated or principally apparent that they are essential.

It is needless to say that when the term "comprises A", "is made of A", "has A", or "includes A" is used, a component other than A is not excluded unless otherwise indicated that the component is only A. Similarly, in the below-described embodiments, when a reference is made to the shape, positional relationship, or the like of the constituent components, that substantially approximate or similar to it is embraced unless otherwise specifically indicated or principally apparent that it is not. This also applies to the above-described value and range.

In all the drawings for describing the following embodiments, members of a like function will be identified by like reference numerals in principle and overlapping descriptions will be omitted. In the cross-sectional views, the size of each site does not correspond to that of an actual device and in order to facilitate understanding of the drawings, certain sites may be sometimes enlarged relatively.

Embodiments will hereinafter be described in detail based on drawings.

(Detailed Description of the Problem of Conventional Technology)

In recent years, there has actively been developed a silicon photonics technology, that is, a technology of achieving an optical communication module by fabricating an optical-signal transmission line from silicon used as a material and integrating various optical devices and electronic devices while using an optical circuit comprised of this optical-signal transmission line as a platform.

In an optical circuit based on an optical waveguide formed on a substrate made of silicon, a silicon waveguide using a core made of silicon has been used mainly. Silicon is a material widely used in an electronic circuit and using this silicon waveguide enables fabrication of an optical circuit and an electronic circuit on the same substrate.

For conversion of an optical signal to an electrical signal, a photoreceiver is indispensable. For the photoreceiver, use of germanium having a forbidden band width narrower than that of silicon is regarded promising, because germanium having a forbidden band width narrower than that of silicon is preferred for detection, on an electronic circuit, of a near infrared light having a wavelength up to about 1.6 μm which is a communication wavelength band; and germanium having high affinity to silicon can be monolithically formed on a silicon waveguide.

Figure 33:
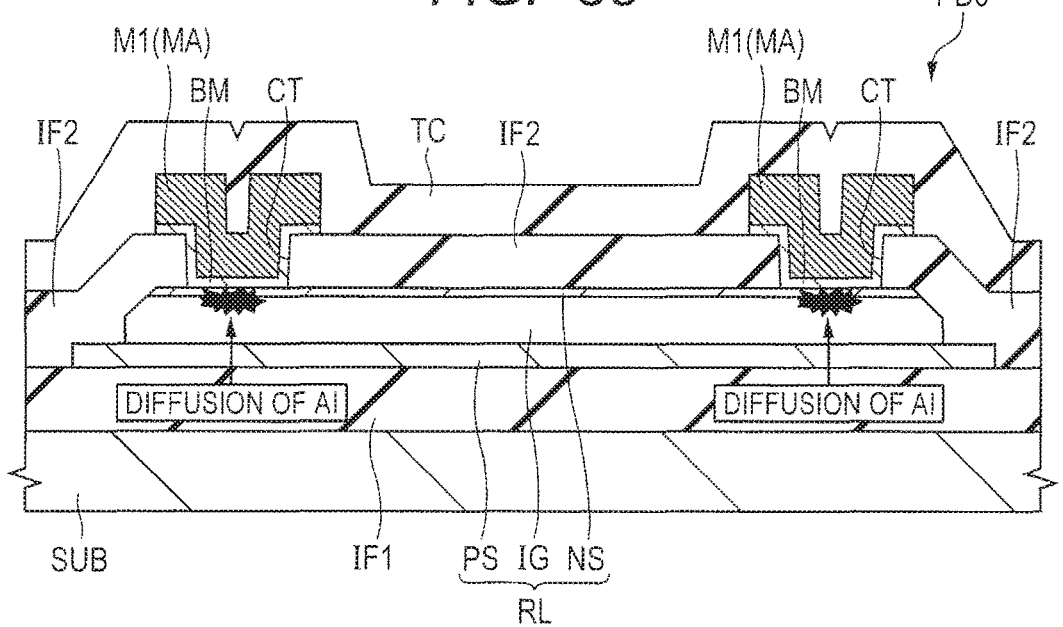
FIG. 33 is a fragmentary cross-sectional view of a germanium photoreceiver compared and investigated by the present inventors prior to the invention.

FIG. 33 is a fragmentary cross-sectional view of a germanium photoreceiver compared and investigated by the present inventors prior to the present invention.

A photoreceiving portion RL of a germanium photoreceiver PD0 is comprised of a p type silicon core layer PS having a p type impurity introduced therein, a non-doped i (intrinsic) type germanium layer IG, and an n type silicon layer NS having an n type impurity introduced therein which are stacked successively on a first insulating film (which is also called "BOX layer" or "lower clad layer") formed on the main surface of a semiconductor substrate SUB.

Further, a second insulating film (which is also called "upper clad layer" or "clad layer") IF2 covers the photoreceiving portion RL therewith. Through a coupling hole CT formed in this second insulating film IL2, a first-layer wiring M1 and the receiving portion RL are electrically coupled to each other. The first-layer wiring M1 is made of an aluminum film MA and the first-layer wiring M1 and the photoreceiving portion RL have therebetween a barrier metal film BM. The barrier metal film BM is, for example, made of a Ti/TiN stacked film having a titanium film as a lower layer and a titanium nitride film as an upper layer, in which the titanium film has a thickness of, for example, about 50 nm and the titanium nitride film has a thickness of, for example, about 60 nm. The first-layer wiring M1 is covered with a protective film TC. The protective film TC is made of, for example, a silicon oxide film.

In the post step, however, application of a thermal stress to the germanium photoreceiver PD0, for example, at from 350° C. to 400° C. for from about 30 minutes to 2 hours sometimes causes diffusion of aluminum from the aluminum film MA to the i type germanium layer IG of the photoreceiving portion RL and further, diffusion of germanium from the i type germanium layer IG to the aluminum layer MA even when the photoreceiver has the barrier metal film BM. When a reaction occurs between germanium and aluminum due to such interdiffusion, the resulting germanium photoreceiver PD0 may fail to show diode characteristics.

It is therefore necessary to prevent diffusion of aluminum into the i type germanium layer IG and thereby prevent the germanium photoreceiver PD0 from having deteriorated diode characteristics.

Also in a pre-step, a thermal stress of, for example, from about 350° C. to 400° C. is sometimes applied to the germanium photoreceiver PD0. The resulting germanium photoreceiver PD0 is however unlikely to have deteriorated diode characteristics, presumably because the thermal stress is applied only for a short time and a reaction between germanium and aluminum is suppressed.

(First Embodiment)
<Structure of Semiconductor Device>

The structure of a germanium photoreceiver of First Embodiment will be described referring to FIG. 1. FIG. 1 is a fragmentary cross-sectional view of the germanium photoreceiver of First Embodiment.

A photoreceiving portion RL of a germanium photoreceiver PD1 of First Embodiment is comprised of a p type silicon core layer PS having a p type impurity introduced therein, a non-doped i type germanium layer IG, and an n type silicon layer NS having an n type impurity introduced therein and is obtained by successively stacking them on a first insulating film IF1 formed on the main surface of a semiconductor substrate SUB. The n type silicon layer NS may be replaced by an n type silicon-germanium layer or an n type germanium layer.

Further, a second insulating film IF2 covers the photoreceiving portion RL. A coupling hole CT formed in this second insulating film IL2 electrically couples a first-layer wiring M1 and the photoreceiving portion RL to each other. The first-layer wiring M1 is made of a tungsten film MW and the first-layer wiring M1 and the photoreceiving portion RL have therebetween a barrier metal film BM.

The configuration of the germanium photoreceiver PD1 will hereinafter be described specifically.

The semiconductor substrate SUB made of single crystal silicon has, on the main surface thereof, the first insulating film IF1. The first insulating film IF1 is made of, for example, a silicon oxide film and has a thickness of, for example, 1 μm or more, preferably from about 2 μm to 3 μm. The first insulating film IF1 functions as a lower clad layer.

The first insulating film IF1 has thereon the p type silicon core layer PS made of silicon having a p type impurity, for example, boron introduced therein. The thickness of the p type silicon core layer PS is presumed to fall appropriately within a range of from 100 nm to 300 nm (needless to say, the range is not limited thereto, which depends on the other conditions), most preferably within a range with 200 nm as a central value.

The p type silicon core layer PS has thereon the i type germanium layer IG. The i type germanium layer IG has, for example, a round pattern or rectangular pattern in plan view. Further, the i type germanium layer IG has thereon the n type silicon layer NS or the n type silicon-germanium layer or n type germanium layer, each having an n type impurity introduced therein. The thickness of the stack of the i type germanium layer IG and the n type silicon layer NS is, for example, from about 0.3 μm to 3 μm.

In short, the semiconductor substrate SUB has, on the main surface thereof, the photoreceiving portion RL via the first insulating film IF1 and it has a vertical pin structure comprised of the p type silicon core layer PS, the i type germanium layer IG, and the n type silicon layer NS.

The second insulating film IF2 covers the photoreceiving portion RL. The second insulating film IF2 is made of, for example, a silicon oxide film and has a thickness of, for example, from about 50 nm to 2 μm.

The second insulating film IF2 has therein the coupling hole CT reaching the photoreceiving portion RL. The coupling hole CT has a width of, for example, from about 100 nm to 200 nm. The coupling hole CT has, on the inner wall (side surface and bottom surface) thereof, the barrier metal film BM and the contact hole CT has therein the first-layer wiring M1 via the barrier metal film BM. The barrier metal film BM is provided in order to prevent diffusion of a metal (tungsten in First Embodiment) which is a conductive material configuring the first-layer wiring M1.

The barrier metal film BM is made of, for example, a titanium film, a tantalum film, a titanium nitride film, or a tantalum nitride film. Alternatively, the barrier metal film BM is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The barrier metal film B has a thickness of, for example, from about 10 nm to 300 nm.

The first-layer wiring M1 is made of a tungsten film MW and has a thickness of, for example, from about 50 nm to 500 nm.

A protective film TC covers the first-layer wiring M1. The protective film TC is made of, for example, a silicon oxide film and the second insulating film IF2 and the protective film TC function as an upper clad layer.

The germanium photoreceiver PD1 of First Embodiment uses the tungsten film MW as a conductive material of the first-layer wiring M1 to be electrically coupled to the photoreceiving portion RL. Even application of a thermal stress to the tungsten film MW, for example, at from 350° C. to 400° C. for from about 30 minutes to 2 hours hardly causes diffusion of tungsten from the tungsten film MW into the i type germanium layer IG configuring the photoreceiving portion RL. Further, the first-layer wiring M1 and the photoreceiving portion RL have therebetween the barrier metal film BM for preventing diffusion of tungsten.

Therefore, a reaction between germanium and tungsten hardly occurs, making it possible to prevent the resulting germanium photoreceiver PD1 from having diode characteristics deteriorated by the above-described thermal stress.

<Method of Manufacturing the Semiconductor Device>

A method of manufacturing the germanium photoreceiver of First Embodiment will be described in order of steps referring to FIGS. 2 to 9. FIGS. 2 to 9 are fragmentary cross-sectional views of the germanium photoreceiver of First Embodiment during manufacturing steps thereof.

Figure 2:
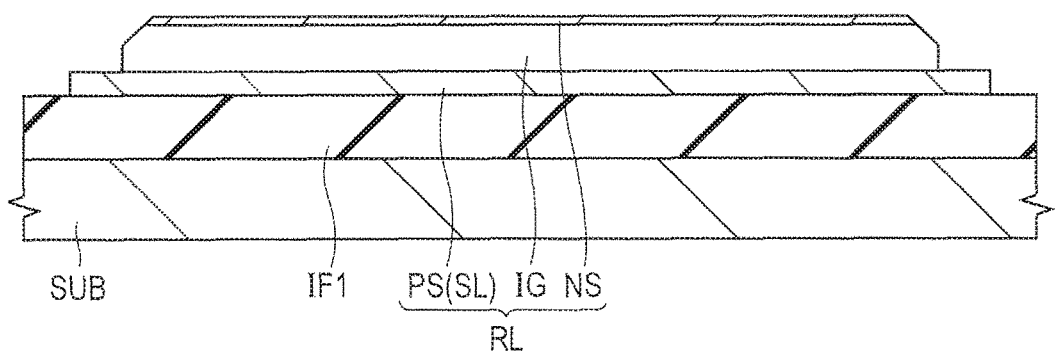
FIG. 2 is a fragmentary cross-sectional view showing a manufacturing step of the germanium photoreceiver of First Embodiment.

A shown in FIG. 2, a SOI (silicon on insulator) substrate (a substrate having a substantially round planar shape is called "SOI wafer" at this stage) is provided, which is comprised of a semiconductor substrate SUB, a first insulating film IF1 formed on the main surface of the semiconductor substrate SUB, and a silicon layer (also called "SOI layer") SL formed on the first insulating film IF1.

The semiconductor substrate SUB is a support substrate made of single crystal silicon and the first insulating film IF1 is made of a silicon oxide film. The first insulating film IF1 has a thickness of, for example, 1 μm or more, preferably from about 2 μm to 3 μm. The silicon layer SL has a p type impurity, for example, boron introduced therein and has a thickness of, for example, from about 100 nm to 300 nm, preferably about 200 nm.

Next, with a resist pattern as a mask, the silicon layer SL is processed into a desired plane pattern by dry etching to form a p type silicon core layer PS. Then a mask made of, for example, a silicon oxide film is formed on the first insulating film IF1 so as to cover the p type silicon core layer PS. The mask has an opening portion which partially exposes the upper surface of the p type silicon core layer PS and this opening portion has, for example, a round pattern or rectangular pattern in plan view.

Next, an i type germanium layer IG is formed selectively on the exposed upper surface of the p type silicon core layer PS. The i type germanium layer IG is formed, for example, by the epitaxial growth method using a monogermane (GeH$_4$) gas at a substrate temperature of 600° C.

Next, an n type silicon layer NS having an n type impurity, for example, phosphorus introduced therein is formed selectively on the upper surface of the i type germanium layer IG. The n type silicon layer NS is formed, for example, by the epitaxial growth method using a disilane (Si$_2$H$_6$) gas, monosilane (SiH$_4$) gas, or dichlorosilane (SiH$_2$Cl$_2$) at a substrate temperature of 600° C. Instead of the n type silicon layer, an n type silicon-germanium layer or an n type germanium layer may be formed. The thickness of the stack of the i type germanium layer IG and the n type silicon layer NS is, for example, from 0.3 μm to 3 μm. The mask is then removed.

As a result, a photoreceiving portion RL having a vertical pin structure comprised of the p type silicon core layer PS, the i type germanium layer IG, and the n type silicon layer NS is formed.

Figure 3:
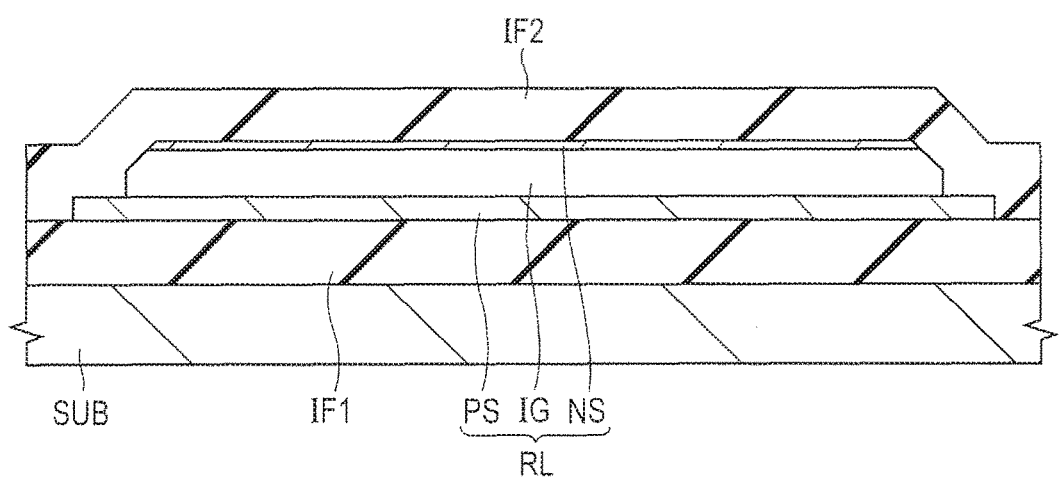
FIG. 3 is a fragmentary cross-sectional view of the germanium photoreceiver during a manufacturing step following that of FIG. 2.

Next, as shown in FIG. 3, a second insulating film IF2 is formed on the first insulating film IF1 so as to cover the photoreceiving portion RL. The second insulating film IF2 is made of a silicon oxide film formed, for example, by plasma CVD (chemical vapor deposition) and has a thickness of, for example, from about 50 nm to 2 μm.

Figure 4:
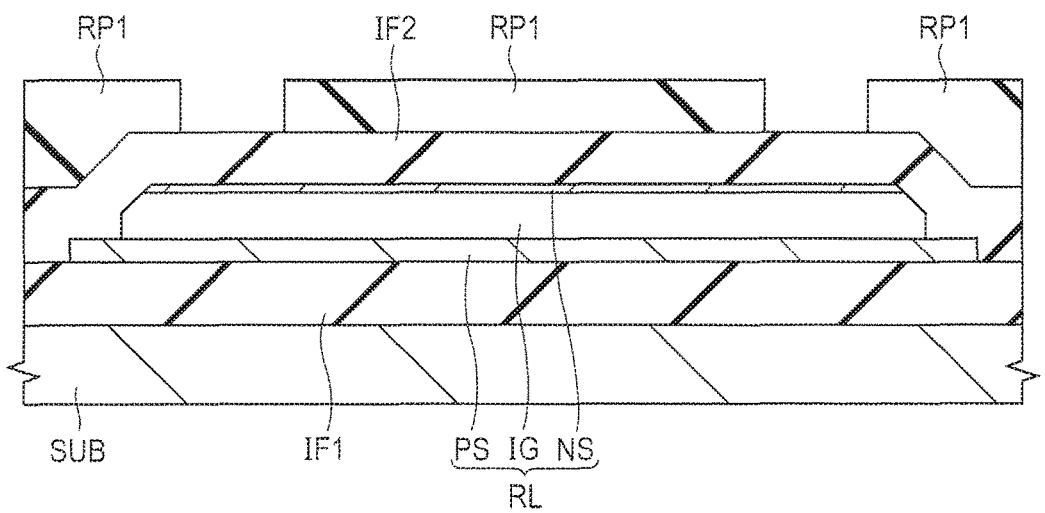
FIG. 4 is a fragmentary cross-sectional view of the germanium photoreceiver during a manufacturing step following that of FIG. 3.

Next, as shown in FIG. 4, a resist film is applied onto the second insulating film IF2 and after exposure, development treatment is performed to pattern the resist film into a resist pattern PR1. The resist pattern RP1 has therein an opening portion that exposes a portion of the upper surface of the photoreceiving portion RL.

Figure 5:
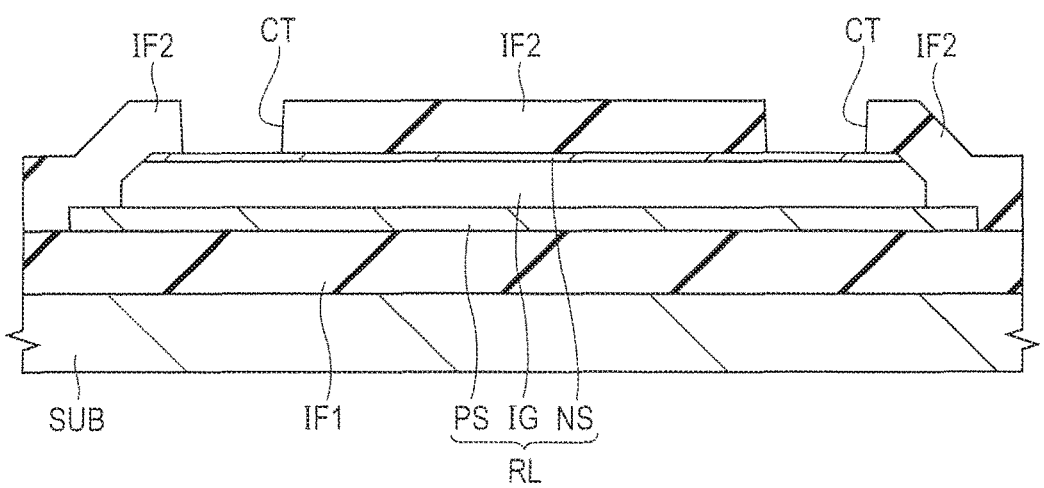
FIG. 5 is a fragmentary cross-sectional view of the germanium photoreceiver during a manufacturing step following that of FIG. 4.

Next, as shown in FIG. 5, with the resist pattern RP1 as a mask, the second insulating film FI2 is processed by dry etching to form a coupling hole CT reaching the photoreceiving portion RL. Then, the resist pattern RP1 is removed. Here, dry etching is used for the processing, but it may be replaced by wet etching or a combination of dry etching and wet etching.

Figure 6:
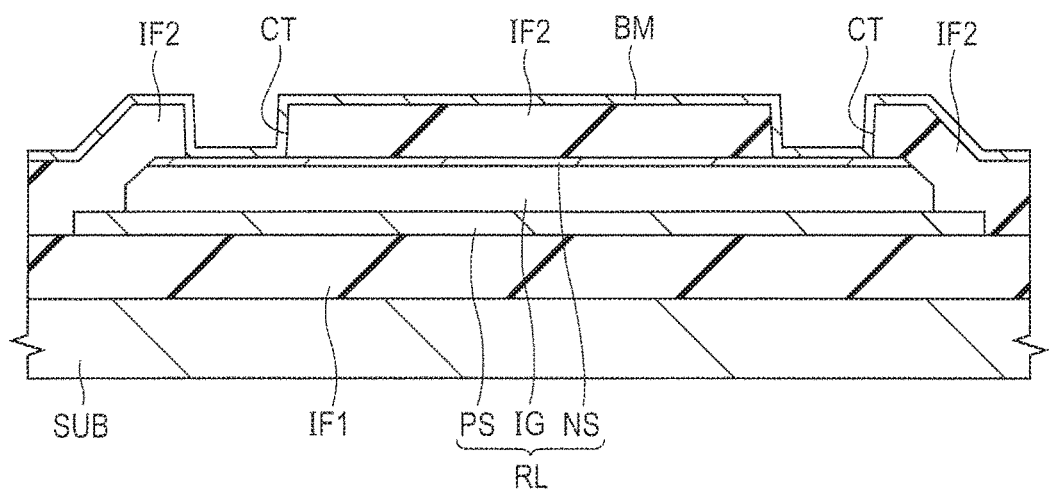
FIG. 6 is a fragmentary cross-sectional view of the germanium photoreceiver during a manufacturing step following that of FIG. 5.

Next, as shown in FIG. 6, a barrier metal film BM is formed on the second insulating film IF2 and also on the inner wall (side surface and bottom surface) of the coupling hole CT, for example, by sputtering. The barrier metal film BM is made of, for example, a titanium film, a tantalum film, or a tantalum nitride film. Alternatively, the barrier metal film BM is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The barrier metal film BM has a thickness of, for example, from about 10 nm to 300 nm.

Figure 7:
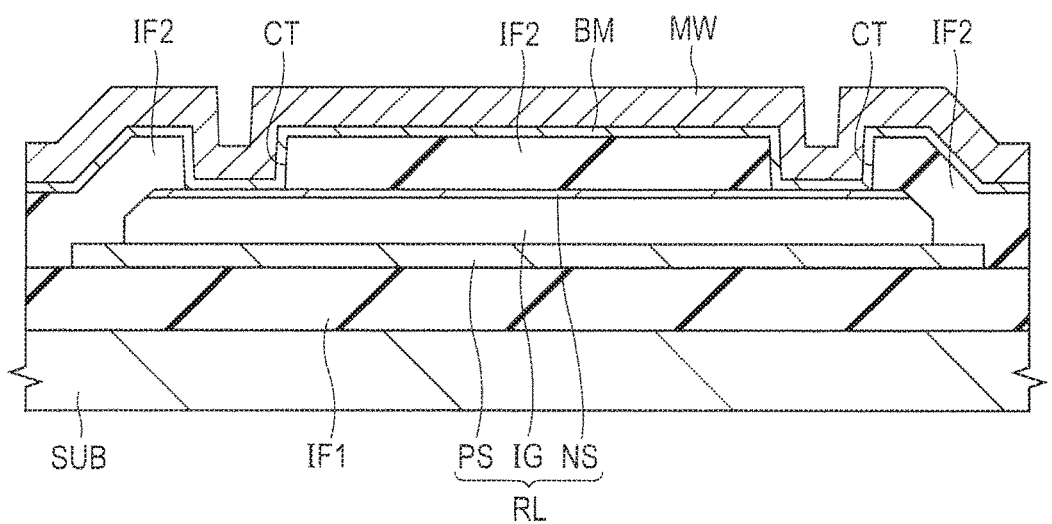
FIG. 7 is a fragmentary cross-sectional view of the germanium photoreceiver during a manufacturing step following that of FIG. 6.

Next, as shown in FIG. 7, a tungsten film MW is formed on the barrier metal film BM, for example, by CVD using a tungsten hexafluoride (WF$_6$) gas. The tungsten film MW has a thickness of, for example, from about 50 nm to 500 nm.

Figure 8:
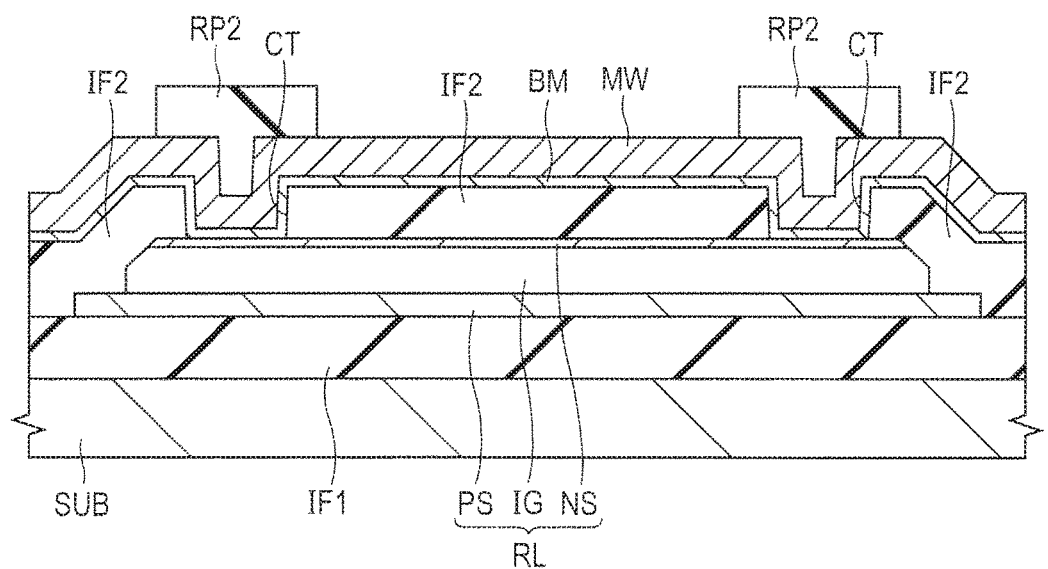
FIG. 8 is a fragmentary cross-sectional view of the germanium photoreceiver during a manufacturing step following that of FIG. 7.

Next, as shown in FIG. 8, a resist film is applied onto the tungsten film MW and after exposure, development treatment is performed to pattern the resist film into a resist pattern RP2.

The resist pattern RP2 is formed in a region where a first-layer wiring M1 is to be formed.

Figure 9:
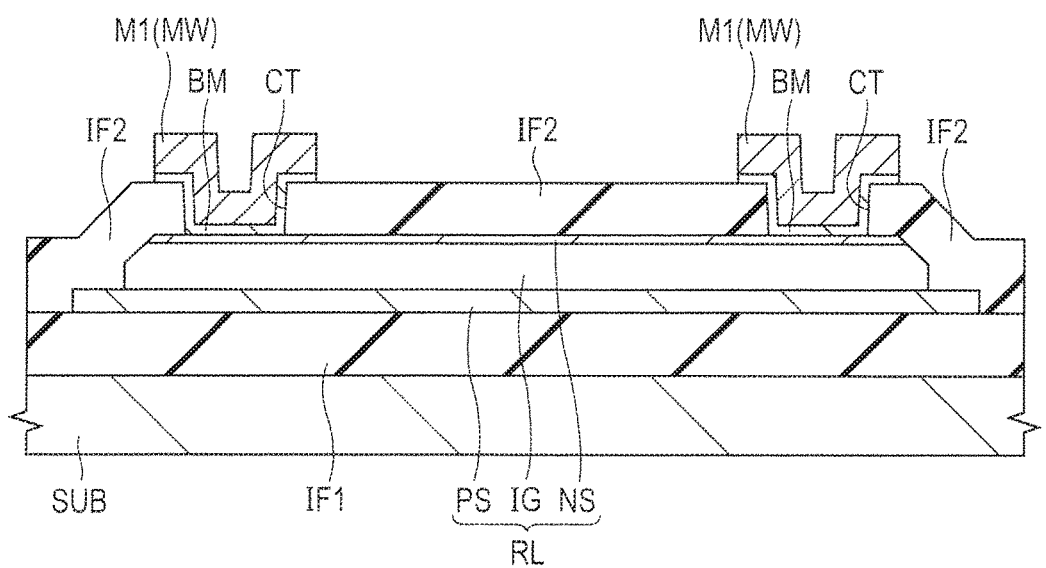
FIG. 9 is a fragmentary cross-sectional view of the germanium photoreceiver during a manufacturing step following that of FIG. 8.

Next, as shown in FIG. 9, with the resist pattern RP2 as a mask, the tungsten film MW and the barrier metal film BM are successively processed by dry etching into a first-layer wiring M1 made of the tungsten film MW.

Then, the resist pattern RP2 is removed and a protective film TC is formed so as to expose a portion of the upper surface of the first-layer wiring M1 (refer to FIG. 1). The protective film TC is made of, for example, a silicon oxide film.

As a result, the germanium photoreceiver PD1 of First Embodiment having a pin structure comprised of the p type silicon core layer PS, the i type germanium layer IG, and the n type silicon layer NS is substantially completed.

In the manufacturing steps of the germanium photoreceiver PD1 of First Embodiment, the upper surfaces of the second insulating film IF2 and the protective film TC are not planarized using, for example, CMP (chemical mechanical polishing). Since this reduces variation in thickness of the second insulating film IF2 and the protective film TC positioned on the upper surface of the photoreceiving portion RL and in addition, prevents formation of scratches (defects) in the second insulating film IF2 and the protective film TC, loss in quantum efficiency is suppressed, making it possible to prevent the resulting germanium photoreceiver PD1 from having deteriorated light receiving performance.

Thus, according to First Embodiment, since the first-layer wiring M1 to be electrically coupled to the photoreceiving portion RL using the i type germanium layer IG as a constituent material is made of the tungsten film MW, the germanium photoreceiver PD1 thus obtained can have high reliability, hardly affected by the thermal stress in the post step.

(Second Embodiment)
<Manufacture of Semiconductor Device>

Figure 10:
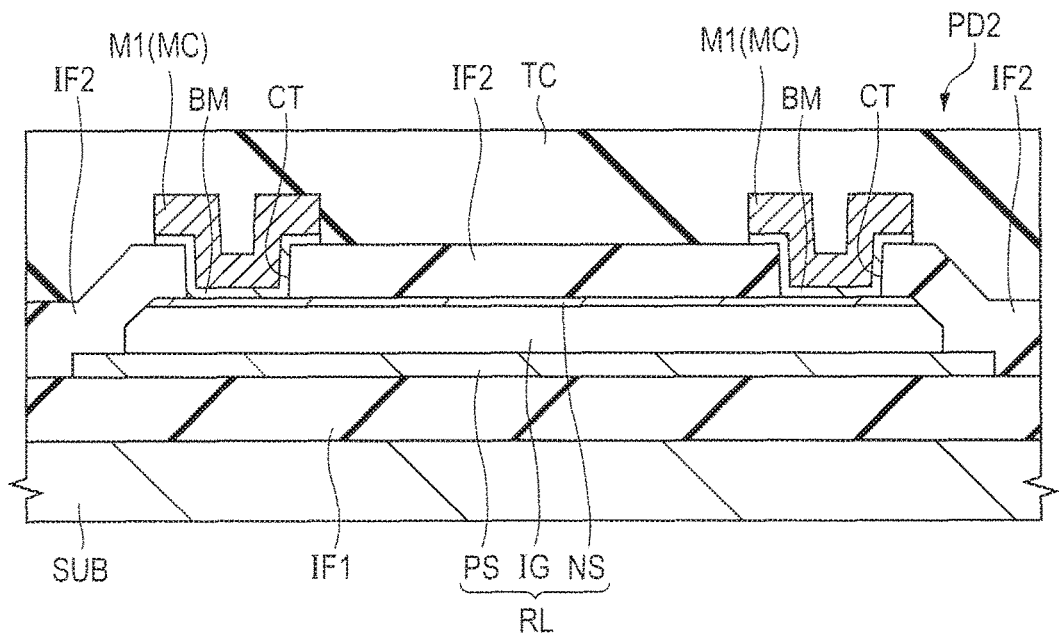
FIG. 10 is a fragmentary cross-sectional view of a germanium photoreceiver of Second Embodiment.

The structure of the germanium photoreceiver of Second Embodiment will next be described referring to FIG. 10. FIG. 10 is a fragmentary cross-sectional view of the germanium photoreceiver of Second Embodiment.

As shown in FIG. 10, the germanium photoreceiver PD2 of Second Embodiment is different from the above-described germanium photoreceiver PD1 of First Embodiment in a conductive material configuring the first-layer wiring M1.

Described specifically, the conductive material configuring the first-layer wiring M1 in the germanium photoreceiver PD1 of First Embodiment is the tungsten film MW, while a conductive material configuring a first-layer wiring M1 in the germanium photoreceiver PD2 of Second Embodiment is a copper film MC.

In the germanium photoreceiver PD2 of Second Embodiment, the copper film MC is used as the conductive material of the first-layer wiring M1 to be electrically coupled to the photoreceiving portion RL. Copper hardly diffuses from the copper film MC into the i type germanium layer IG configuring the photoreceiving portion RL even when a thermal stress is applied, for example, at from 350° C. to 400° C. for from about 30 minutes to 2 hours. Further, the first-layer wiring M1 and the photoreceiving portion RL have therebetween a barrier metal film BM for preventing diffusion of copper.

A reaction therefore hardly occurs between germanium and copper, making it possible to prevent the resulting germanium photoreceiver PD2 from having diode characteristics deteriorated by the above-described thermal stress.

<Method of Manufacturing the Semiconductor Device>

A method of manufacturing the germanium photoreceiver of Second Embodiment will be described in order of steps referring to FIGS. 11 to 15. FIGS. 11 to 15 are fragmentary cross-sectional views of the germanium photoreceiver of Second Embodiment during manufacturing steps thereof.

Figure 11:
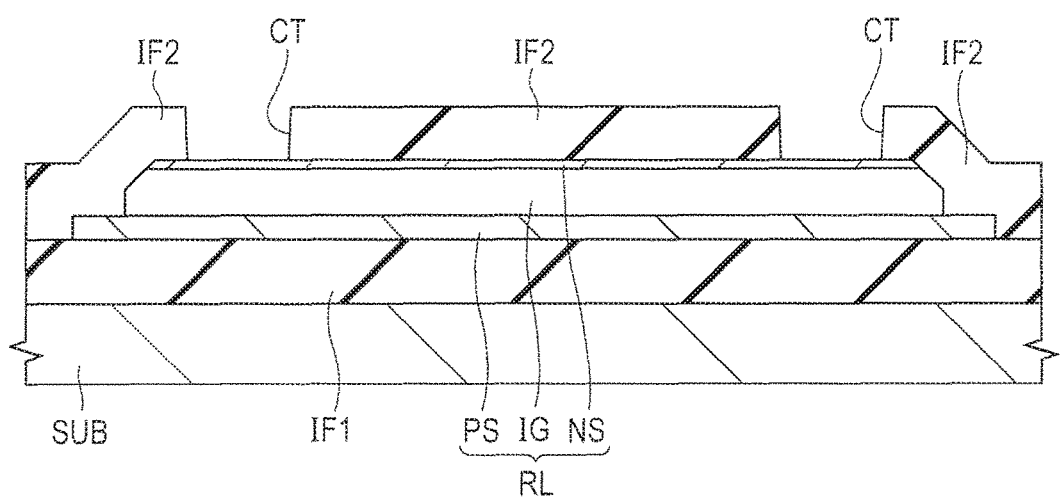
FIG. 11 is a fragmentary cross-sectional view showing a manufacturing step of the germanium photoreceiver of Second Embodiment.

First, as shown in FIG. 11, similar to First Embodiment, a photoreceiving portion RL having a vertical pin structure comprised of a p type silicon core layer PS, an i type germanium layer IG, and an n type silicon layer NS is formed via a first insulating film IF1 on the main surface of a semiconductor substrate SUB (refer to FIG. 2). Then, a second insulating film IF2 formed on the first insulating film IF1 so as to cover the photoreceiving portion RL is processed to form a coupling hole CT reaching the photoreceiving portion RL (refer to FIGS. 3 to 5).

Figure 12:
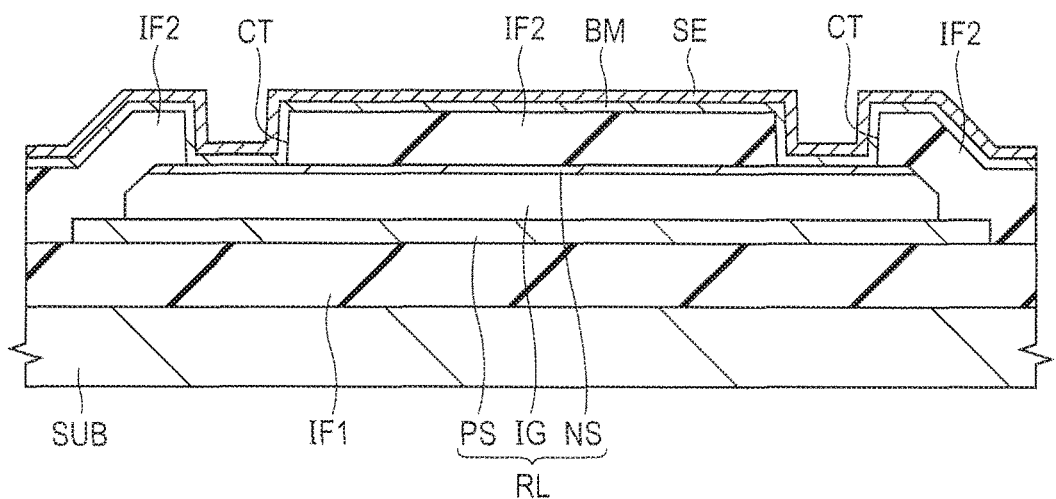
FIG. 12 is a fragmentary cross-sectional view of the germanium photoreceiver during a manufacturing step following that of FIG. 11.

Next, as shown in FIG. 12, a barrier metal film BM is formed on the second insulating film IF2 and also on the inner wall (side surface and bottom surface) of the coupling hole CT, for example, by sputtering. The barrier metal film BM is made of, for example, a titanium film, a tantalum film, a titanium nitride film, or a tantalum nitride film. Alternatively, the barrier metal film BM is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The barrier metal film BM has a thickness of, for example, from about 10 nm to 300 nm.

Next, a copper seed layer SE is formed on the barrier metal film BM, for example, by sputtering or CVD.

Figure 13:
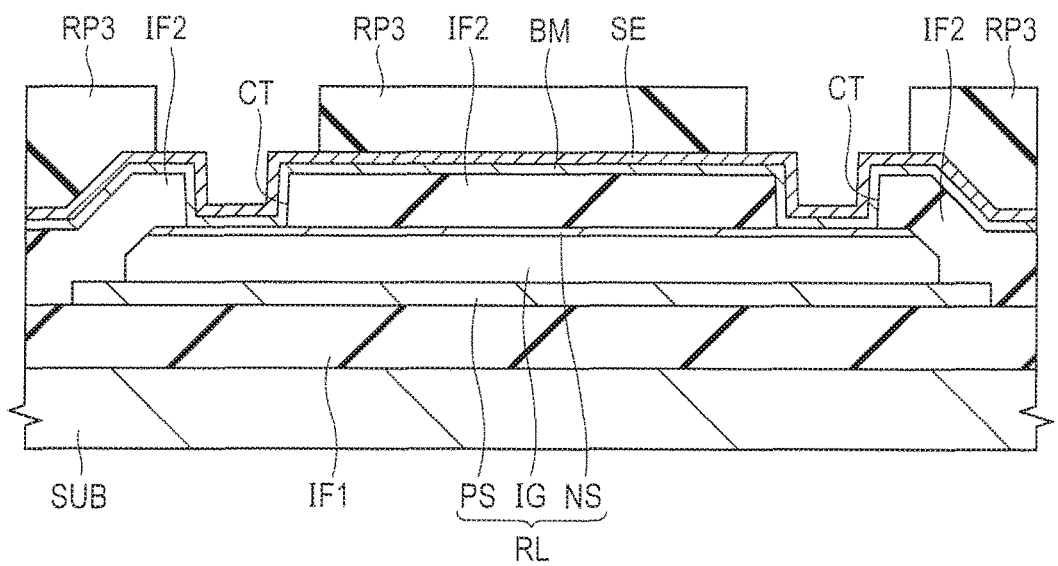
FIG. 13 is a fragmentary cross-sectional view of the germanium photoreceiver during a manufacturing step following that of FIG. 12.

Next, as shown in FIG. 13, a resist film is applied onto the seed layer SE. After exposure, development treatment is performed to pattern the resist film into a resist pattern RP3. The resist pattern RP3 has, in a region where a first-layer wiring M1 is to be formed, an opening portion for exposing a portion of the upper surface of the seed layer SE.

Figure 14:
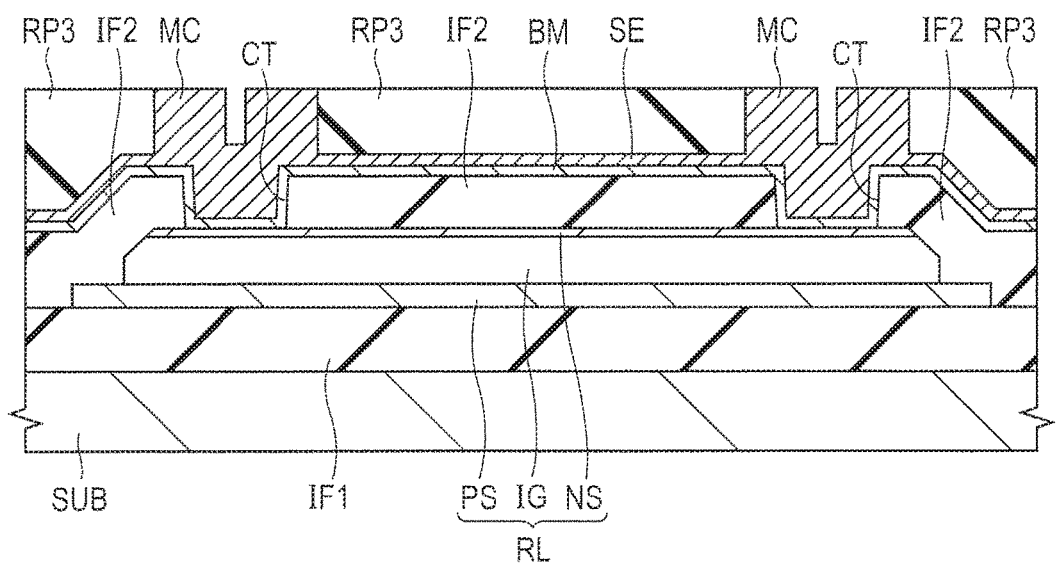
FIG. 14 is a fragmentary cross-sectional view of the germanium photoreceiver during a manufacturing step following that of FIG. 13.

Next, as shown in FIG. 14, a copper film MC is formed on a portion of the exposed upper surface of the seed layer SE, for example, by electroplating. This means that the opening portion formed in the resist pattern RP3 is filled with the copper film MC.

Figure 15:
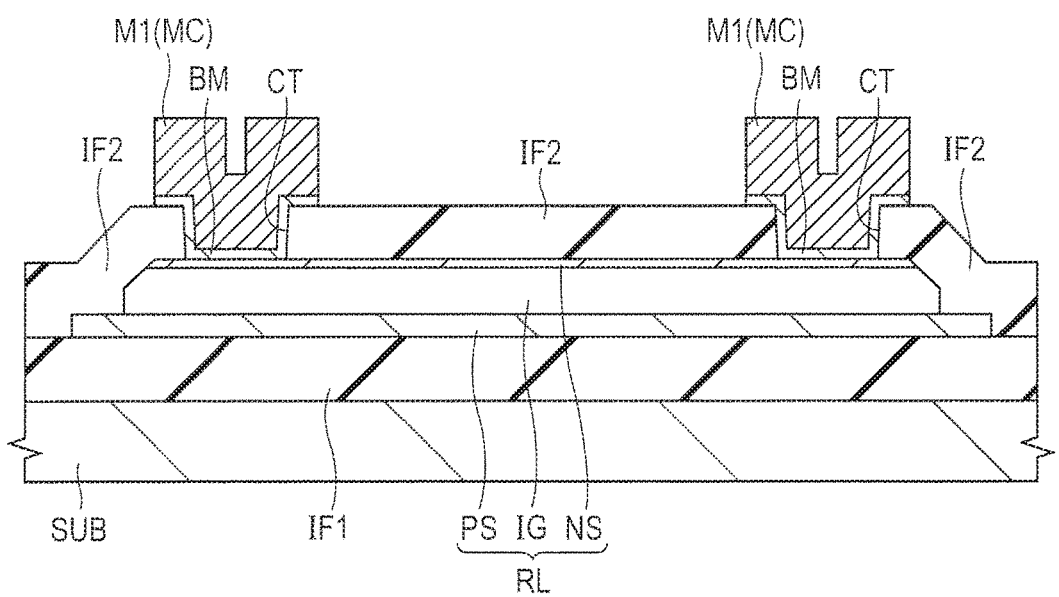
FIG. 15 is a fragmentary cross-sectional view of the germanium photoreceiver during a manufacturing step following that of FIG. 14.

Next, as shown in FIG. 15, after removal of the resist pattern RP3, the exposed seed layer SE and the barrier metal film BM are removed successively to form a first-layer wiring M1 comprised of the copper film MC.

Next, a protective film TC is formed so as to expose a portion of the upper surface of the first-layer wiring M1 (refer to FIG. 10). The protective film TC is made of, for example, a polyimide film.

As a result, the germanium photoreceiver PD2 of Second Embodiment having a pin structure comprised of the p type silicon core layer PS, the i type germanium layer IG, and the n type silicon layer NS is substantially completed.

Thus, according to Second Embodiment, since the first-layer wiring M1 to be electrically coupled to the photoreceiving portion RL using the i type germanium layer IG as a constituent material is made of the copper film MC, the germanium photoreceiver PD2 thus obtained can have high reliability, hardly affected by the thermal stress in the post step.

(Third Embodiment)
<Structure of Semiconductor Device>

Figure 16:
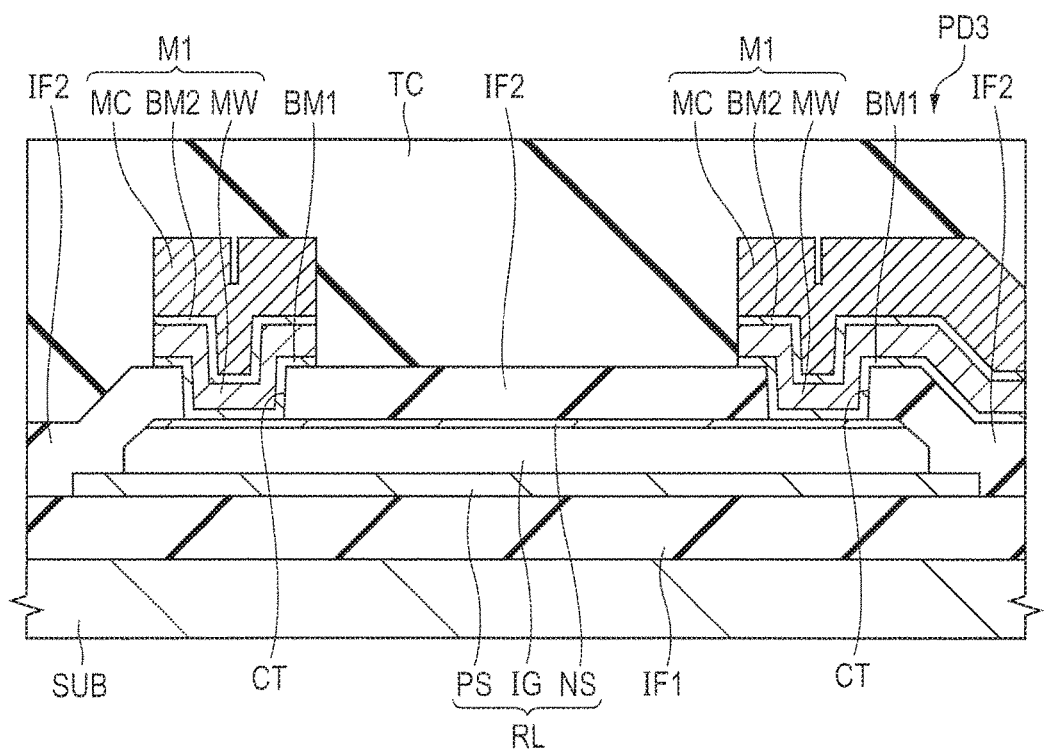
FIG. 16 is a fragmentary cross-sectional view of a germanium photoreceiver of Third Embodiment.

The structure of a germanium photoreceiver of Third Embodiment will be described referring to FIG. 16. FIG. 16 is a fragmentary cross-sectional view of the germanium photoreceiver of Third Embodiment.

As shown in FIG. 16, the germanium photoreceiver PD3 of Third Embodiment is different from the germanium photoreceiver PD1 of First Embodiment in a conductive material configuring the first-layer wiring M1.

Described specifically, the conductive material configuring the first-layer wiring M1 in the above-described germanium photoreceiver PD1 of First Embodiment is the tungsten film MW, while the conductive material configuring the first-layer wiring M1 in the germanium photoreceiver PD3 of Third Embodiment is a stacked film of the tungsten film MW and the copper film MC.

The germanium photoreceiver PD3 of Third Embodiment uses, as the conductive material of the first-layer wiring M1 to be electrically coupled to the photoreceiving portion RL, a stacked film having the tungsten film MW as a lower layer and the copper film MC as an upper layer. Tungsten hardly diffuses from the tungsten film MW into the i type germanium layer IG configuring the photoreceiving portion RL even when a thermal stress is applied, for example, at from 350° C. to 400° C. for from about 30 minutes to 2 hours. Further, the tungsten film MW and the photoreceiving portion RL have therebetween a first barrier metal film BM1 for preventing diffusion of tungsten.

In addition, since the copper film MC and the photoreceiving portion RL have therebetween the first barrier metal film BM1, the tungsten film MW, and a second barrier metal film BM2, copper hardly diffuses from the copper film MC into the i type germanium layer IG configuring the photoreceiving portion RL even when the above-described thermal stress is applied.

Therefore, a reaction between germanium and tungsten or copper hardly occurs, making it possible to prevent the resulting germanium photoreceiver PD3 from having diode characteristics deteriorated by the above-described thermal stress.

Further, in general, a tungsten film has a resistance higher than that of an aluminum film or a copper film but in the germanium photoreceiver PD3 of Third Embodiment, the first-layer wiring M1 can have a reduced resistance because the copper film MC is formed on the tungsten film MW. The first barrier metal film BM1, the tungsten film MW, and the second barrier metal film BM2 have thicknesses of, for example, 10 nm, 50 nm, and 10 nm, respectively.

<Method of Manufacturing the Semiconductor Device>

A method of manufacturing the germanium photoreceiver of Third Embodiment will be described in order of steps referring to FIGS. 17 to 21. FIGS. 17 to 21 are fragmentary cross-sectional views of the germanium photoreceiver of Third Embodiment during manufacturing steps thereof.

Figure 17:
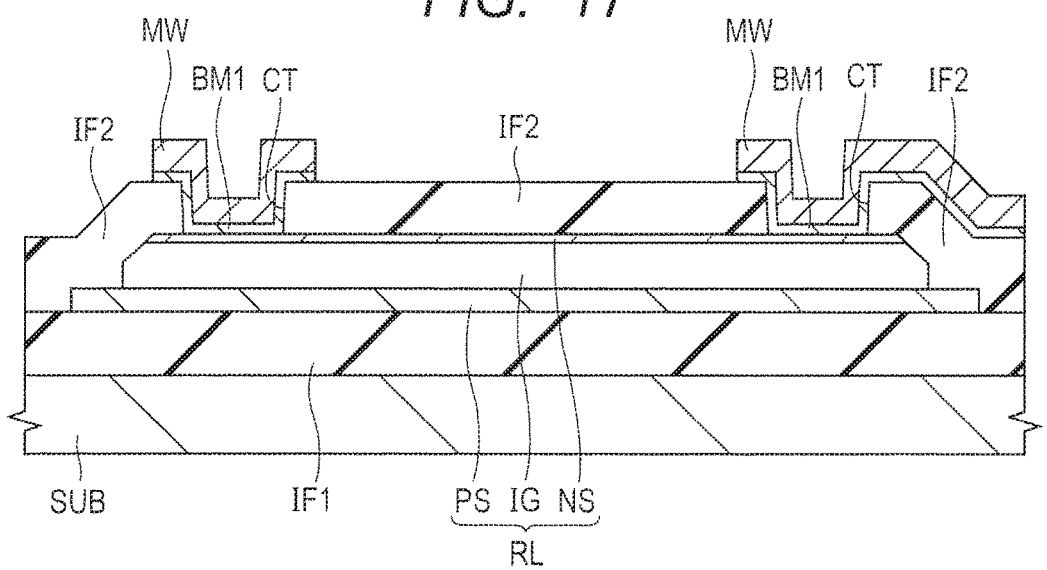
FIG. 17 is a fragmentary cross-sectional view showing a manufacturing step of a germanium photoreceiver of Third Embodiment.

First, as shown in FIG. 17, similar to First Embodiment, a photoreceiving portion RL having a vertical pin structure comprised of a p type silicon core layer PS, an i type germanium layer IG, and an n type silicon layer NS is formed via a first insulating film IF1 on the main surface of a semiconductor substrate SUB (refer to FIG. 2). Then, a second insulating film IF2 formed on the first insulating film IF1 so as to cover the photoreceiving portion RL is processed to form a coupling hole CT reaching the photoreceiving portion RL (refer to FIGS. 3 to 5).

Further, a tungsten film MW is formed which configures the lower portion of the first-layer wiring M1 and is electrically coupled to the photoreceiving portion RL via the coupling hole CT (refer to FIGS. 6 to 9).

The tungsten film MW and the photoreceiving portion RL have therebetween a first barrier metal film BM1. The first barrier metal film BM1 is made of, for example, a titanium film, a tantalum film, a titanium nitride film, or a tantalum nitride film. Alternatively, the first barrier metal film BM1 is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The barrier metal film BM has a thickness of, for example, from about 10 nm to 300 nm.

Figure 18:
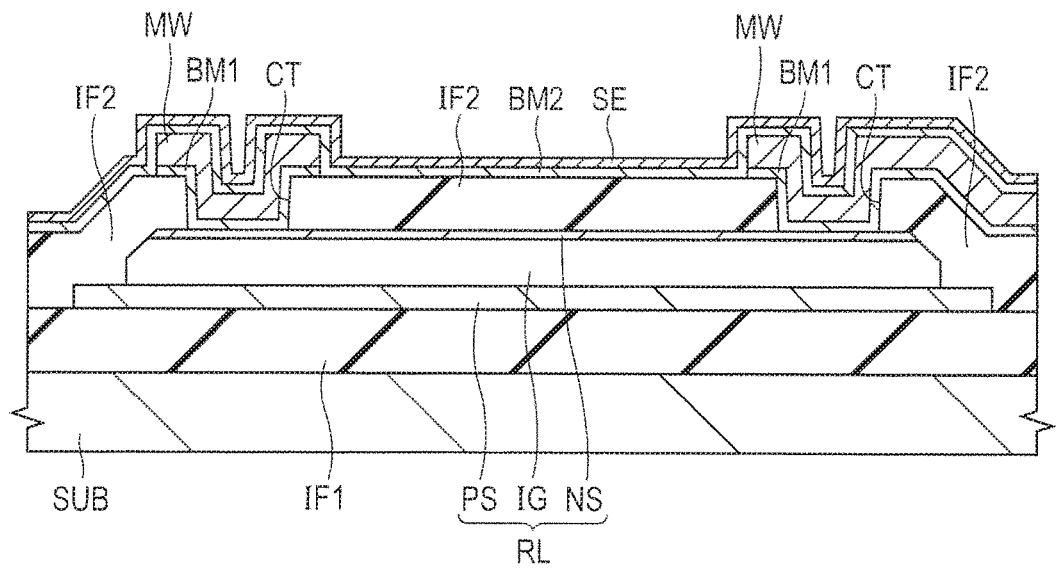
FIG. 18 is a fragmentary cross-sectional view of the germanium photoreceiver during a manufacturing step following that of FIG. 17.

Next, as shown in FIG. 18, a second barrier metal film BM2 is formed on the second insulating film IF2, for example, by sputtering so as to cover the tungsten film MW therewith. The second barrier metal film BM2 is made of, for example, a titanium film, a tantalum film, a titanium nitride film, or a tantalum nitride film. Alternatively, the second barrier metal film BM2 is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The second barrier metal film BM2 has a thickness of, for example, from about 10 nm to 300 nm.

Next, a copper seed layer SE is formed on the second barrier metal film BM2, for example, by sputtering or CVD.

Figure 19:
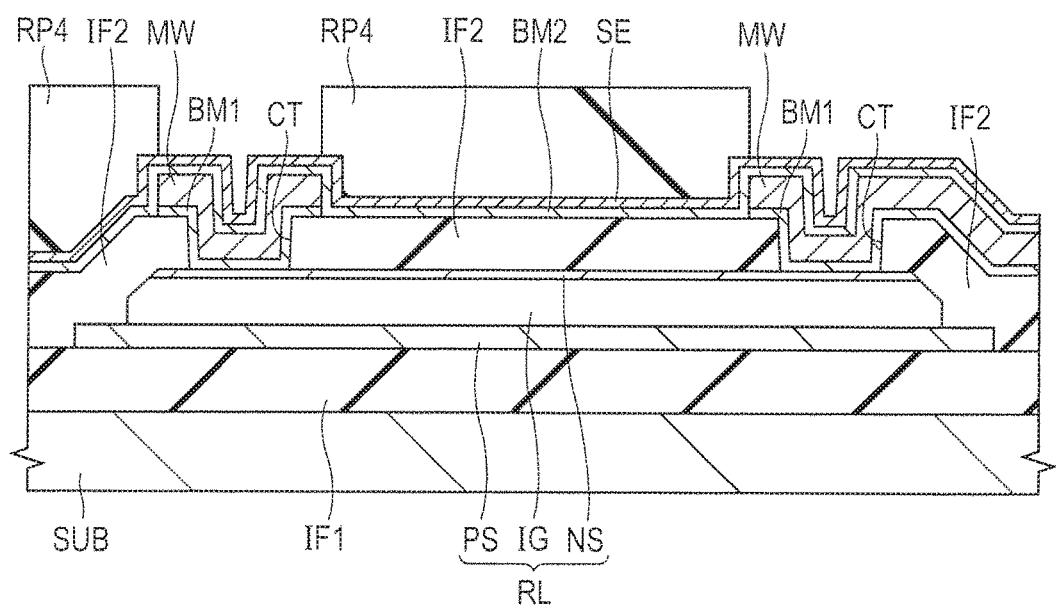
FIG. 19 is a fragmentary cross-sectional view of the germanium photoreceiver during a manufacturing step following that of FIG. 18.

Next, as shown in FIG. 19, a resist film is applied onto the seed layer SE. After exposure, development treatment is performed to pattern the resist film into a resist pattern RP4. The resist pattern RP4 has, in a region where a first-layer wiring M1 is to be formed, an opening portion which exposes a portion of the upper surface of the seed layer SE.

Figure 20:
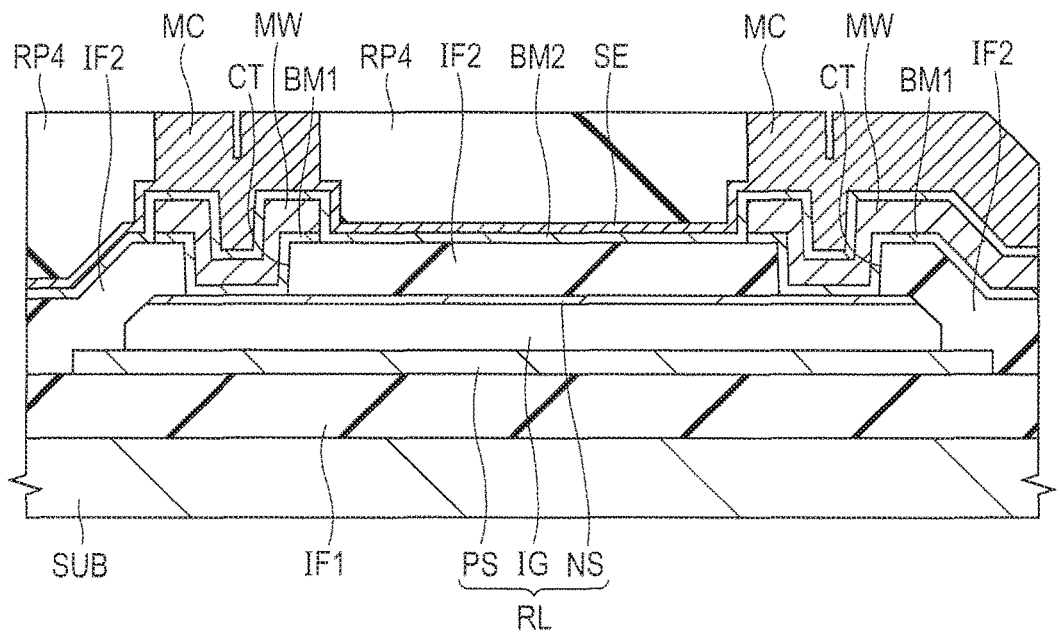
FIG. 20 is a fragmentary cross-sectional view of the germanium photoreceiver during a manufacturing step following that of FIG. 19.

Next, as shown in FIG. 20, a copper film MC is formed on a portion of the exposed upper surface of the seed layer SE, for example, by electroplating. This means that the opening portion formed in the resist pattern RP4 is filled with the copper film MC.

Figure 21:
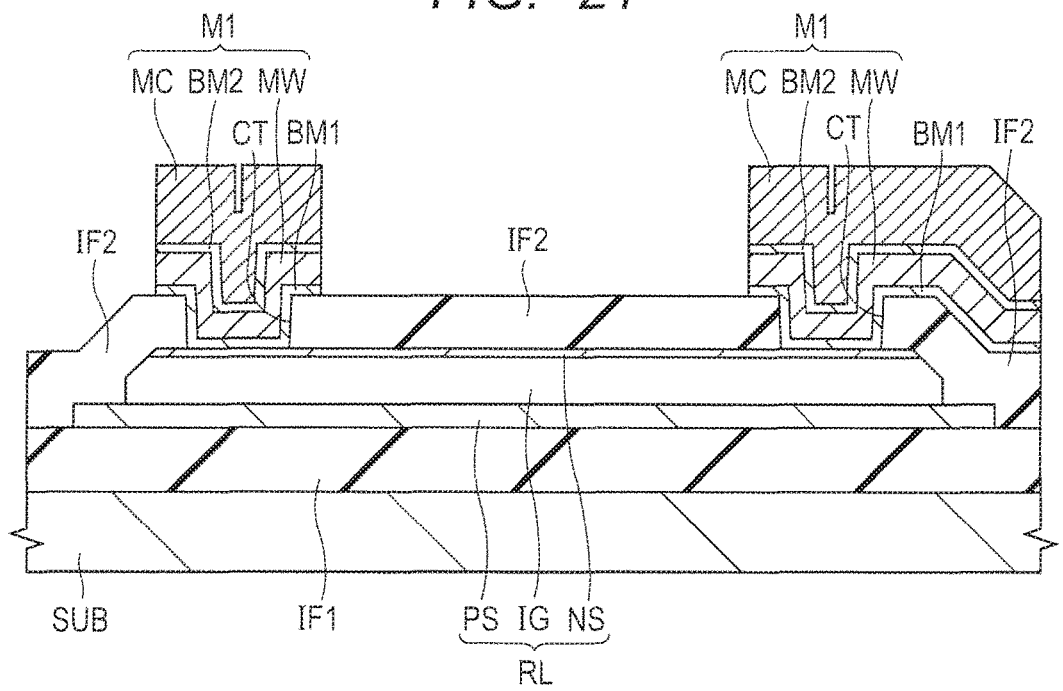
FIG. 21 is a fragmentary cross-sectional view of the germanium photoreceiver during a manufacturing step following that of FIG. 20.

Next, as shown in FIG. 21, after removal of the resist pattern RP4, the exposed seed layer SE and the second barrier metal film BM2 are removed successively to form a first-layer wiring M1 having a stacked structure having the tungsten film MW as a lower layer and the copper film MC as an upper layer.

Then, a protective film TC is formed so as to expose a portion of the upper surface of the first-layer wiring M1 (refer to FIG. 16). The protective film TC is made of, for example, a polyimide film.

As a result, the germanium photoreceiver PD3 of Third Embodiment having a pin structure comprised of the p type silicon core layer PS, the i type germanium layer IG, and the n type silicon layer NS is substantially completed.

<Modification Example of Third Embodiment>

Figure 22:
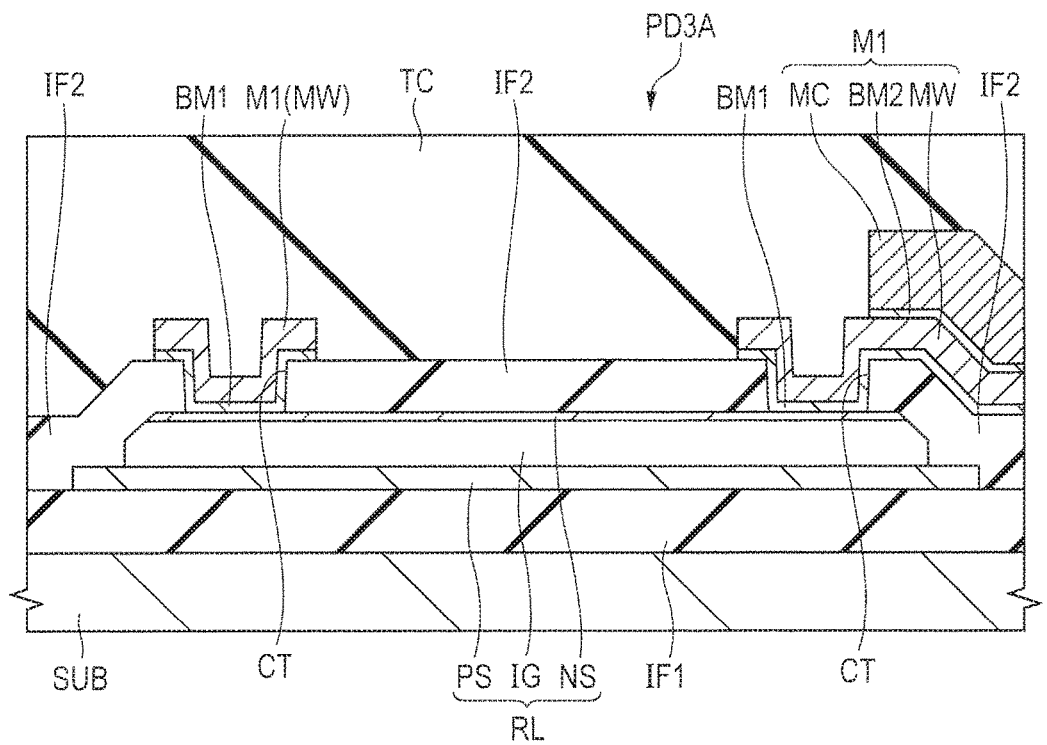
FIG. 22 is a fragmentary cross-sectional view of a germanium photoreceiver of Modification Example of Third Embodiment.

The structure of a germanium photoreceiver according to Modification Example of Third Embodiment will be described referring to FIG. 22. FIG. 22 is a fragmentary cross-sectional view of the germanium photoreceiver of Modification Example of Third Embodiment.

When the width of the coupling hole CT is, for example, 100 nm or less, it is sometimes difficult to fill the coupling hole CT with the copper film MC by electroplating.

In such a case, as shown in FIG. 22, a first-layer wiring M1 comprised only of the tungsten film MW is formed in the coupling hole CT via the first barrier metal film BM1 and in a region other than the inside of the coupling hole CT, a first-layer wiring M1 having a stacked structure with the tungsten film MW as a lower layer and the copper film MC as an upper layer is formed.

The tungsten film MW configuring the lower layer of the first-layer wiring M1 is electrically coupled to the photoreceiving portion RL via the barrier metal film BM so that as described above, a reaction between germanium and tungsten hardly occurs. This makes it possible to prevent a thermal stress from causing deterioration in the diode characteristics of the germanium photoreceiver PD3A thus obtained.

On the other hand, the first-layer wiring M1, such as an extended wiring, having a long wiring length can have a reduced resistance by stacking the copper film MC on the tungsten film MW.

Thus, according to Third Embodiment, since the first-layer wiring M1 to be electrically coupled to the photoreceiving portion RL using the i type germanium layer IG as a constituent material has a stacked structure of the tungsten film MW and the copper film MC, the germanium photoreceiver PD3A thus obtained can have high reliability, hardly affected by the thermal stress in the post step.

Further, the first-layer wiring M1 comprised only of the tungsten film MW may have an increased wiring resistance, but the first-layer wiring M1 obtained by stacking the copper film MC on the tungsten film MW can have a reduced wiring resistance.

(Fourth Embodiment)
<Structure of Semiconductor Device>

Figure 23:
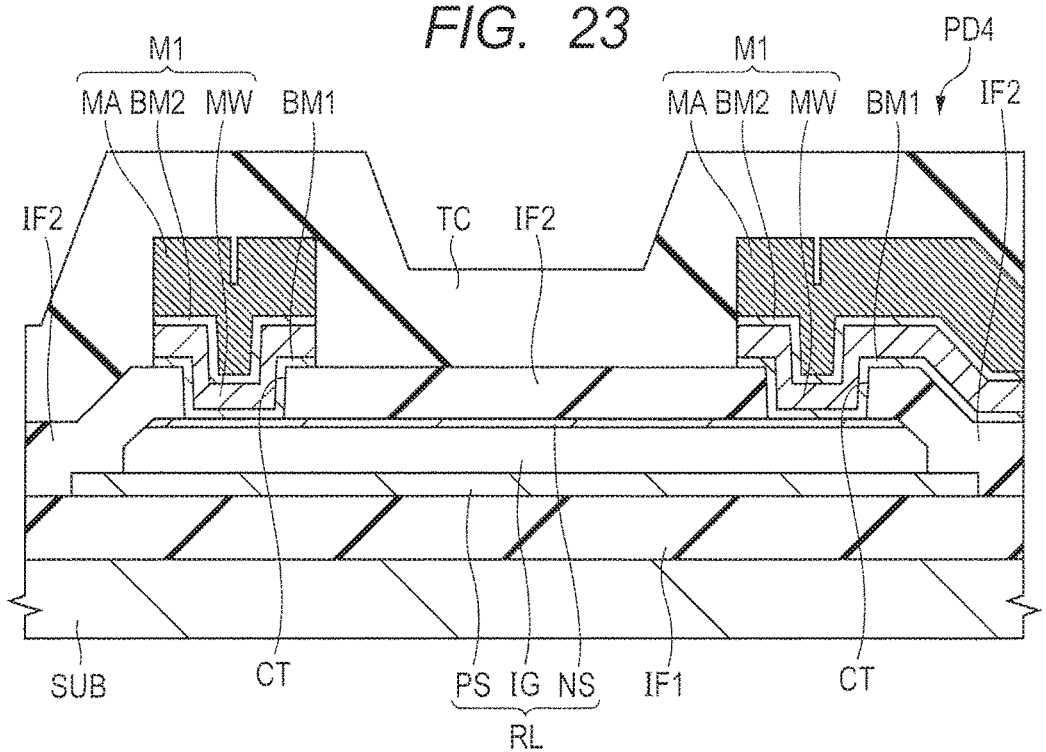
FIG. 23 is a fragmentary cross-sectional view of a germanium photoreceiver of Fourth Embodiment.

The structure of a germanium photoreceiver of Fourth Embodiment will be described referring to FIG. 23. FIG. 23 is a fragmentary cross-sectional view of the germanium photoreceiver of Fourth Embodiment.

As shown in FIG. 23, the germanium photoreceiver PD4 of Fourth Embodiment is different from the germanium photoreceiver PD1 of First Embodiment in a conductive material configuring the first-layer wiring M1.

Described specifically, the conductive material configuring the first-layer wiring M1 in the above-described germanium photoreceiver PD1 of First Embodiment is the tungsten film MW, while the conductive material configuring the first-layer wiring M1 in the germanium photoreceiver PD4 of Fourth Embodiment is a stacked film of the tungsten film MW and an aluminum film MA.

The germanium photoreceiver PD4 of Fourth Embodiment uses, as the conductive material of the first-layer wiring M1 to be electrically coupled to the photoreceiving portion RL, the stacked film having the tungsten film MW as a lower layer and the aluminum film MA as an upper layer. Tungsten hardly diffuses from the tungsten film MW into the i type germanium layer IG configuring the photoreceiving portion RL even when a thermal stress is applied to the tungsten film MW, for example, at from 350° C. to 400° C. for from about 30 minutes to 2 hours. Further, the tungsten film MW and the photoreceiving portion RL have therebetween the first barrier metal film BM1 which prevents diffusion of tungsten.

The aluminum film MA and the photoreceiving portion RL have therebetween the first barrier metal film BM1, the tungsten film MW, and the second barrier metal film BM2 so that aluminum hardly diffuses from the aluminum film MA into the i type germanium layer IG configuring the photoreceiving portion RL even when the thermal stress is applied.

Therefore, a reaction between germanium and tungsten or aluminum hardly occurs, making it possible to prevent the resulting germanium photoreceiver PD4 from having diode characteristics deteriorated by the above-described thermal stress.

Further, in general, a tungsten film typically has a resistance higher than that of an aluminum film or a copper film. The aluminum film MA is formed on the tungsten film MW in the germanium photoreceiver PD4 of Fourth Embodiment so that the first-layer wiring M1 can have a reduced resistance. The first barrier metal film BM1, the tungsten film MW, and the second barrier metal film BM2 have thicknesses of, for example, 10 nm, 50 nm, and 10 nm, respectively.

<Method of Manufacturing the Semiconductor Device>

A method of manufacturing the germanium photoreceiver of Fourth Embodiment will be described in order of steps referring to FIGS. 24 to 27. FIGS. 24 to 27 are fragmentary cross-sectional views of the germanium photoreceiver of Fourth Embodiment during manufacturing steps thereof.

Figure 24:
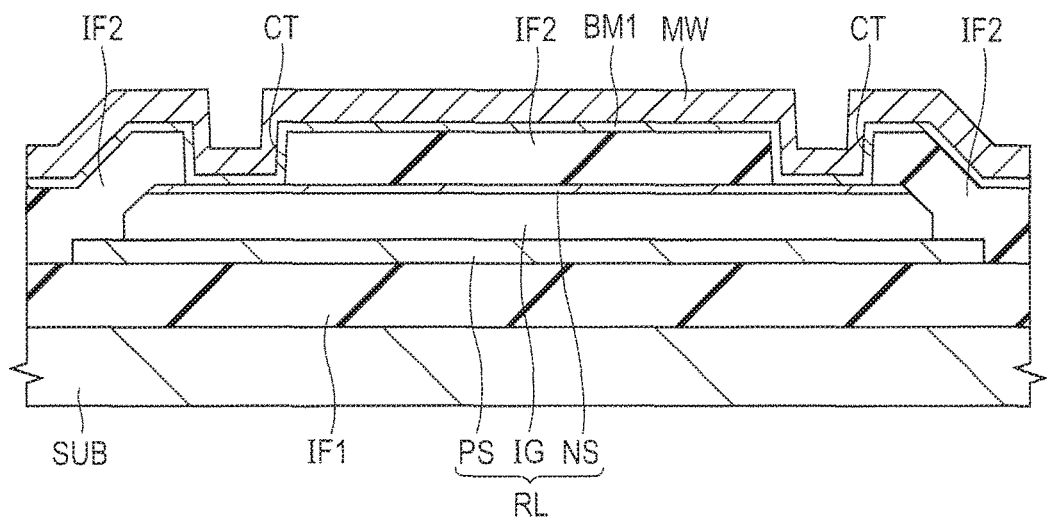
FIG. 24 is a fragmentary cross-sectional view showing a manufacturing step of the germanium photoreceiver of Fourth Embodiment.

First, as shown in FIG. 24, similar to First Embodiment, a photoreceiving portion RL having a vertical pin structure comprised of a p type silicon core layer PS, an i type germanium layer IG, and an n type silicon layer NS is formed on the main surface of a semiconductor substrate SUB via a first insulating film IF1 (refer to FIG. 2). Then, a second insulating film IF2 formed on the first insulating film IF1 so as to cover the photoreceiving portion RL is processed to form a coupling hole CT reaching the photoreceiving portion RL (refer to FIGS. 3 to 5).

Further, a first barrier metal film BM1 is formed on the second insulating film IF2 and also on the inner wall (side surface and bottom surface) of the coupling hole CT and a tungsten film MW is formed on the first barrier metal film BM1 (refer to FIGS. 6 and 7). The first barrier metal film BM1 is made of, for example, a titanium film, a tantalum film, a titanium nitride film, or a tantalum nitride film. Alternatively, the first barrier metal film BM1 is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The first barrier metal film BM1 has a thickness of, for example, from about 10 nm to 300 nm.

Figure 25:
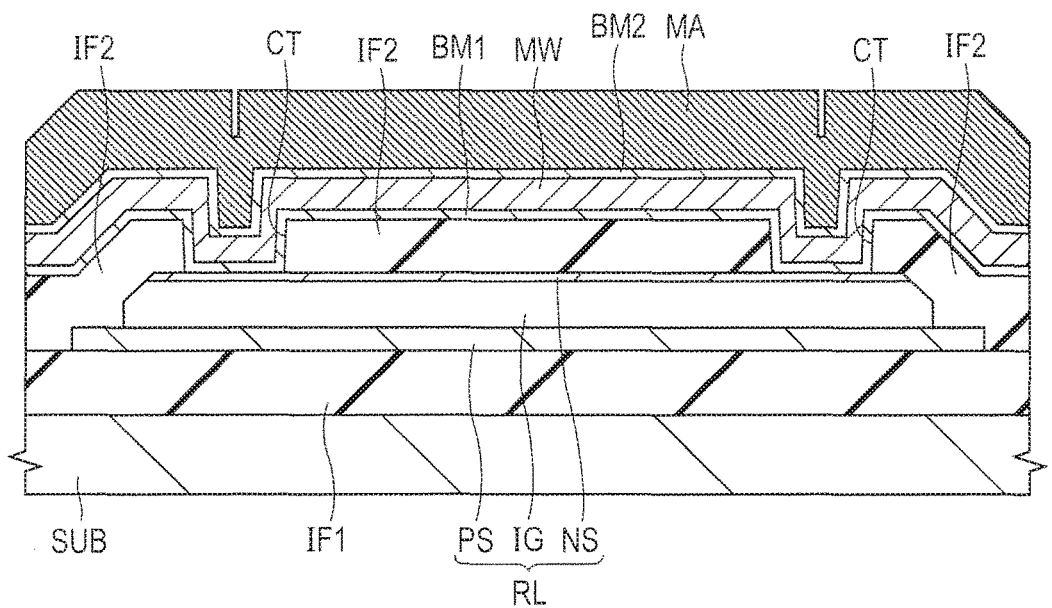
FIG. 25 is a fragmentary cross-sectional view of the germanium photoreceiver during a manufacturing step following that of FIG. 24.

Next, as shown in FIG. 25, a second barrier metal film BM2 is formed on the tungsten film MW, for example, by sputtering.

The second barrier metal film BM2 is made of, for example, a titanium film, a tantalum film, a titanium nitride film, or a tantalum nitride film. Alternatively, the second barrier metal film BM2 is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The second barrier metal film BM2 has a thickness of, for example, from about 10 nm to 300 nm.

Next, an aluminum film MA is formed on the second barrier metal film BM2, for example, by sputtering.

Figure 26:
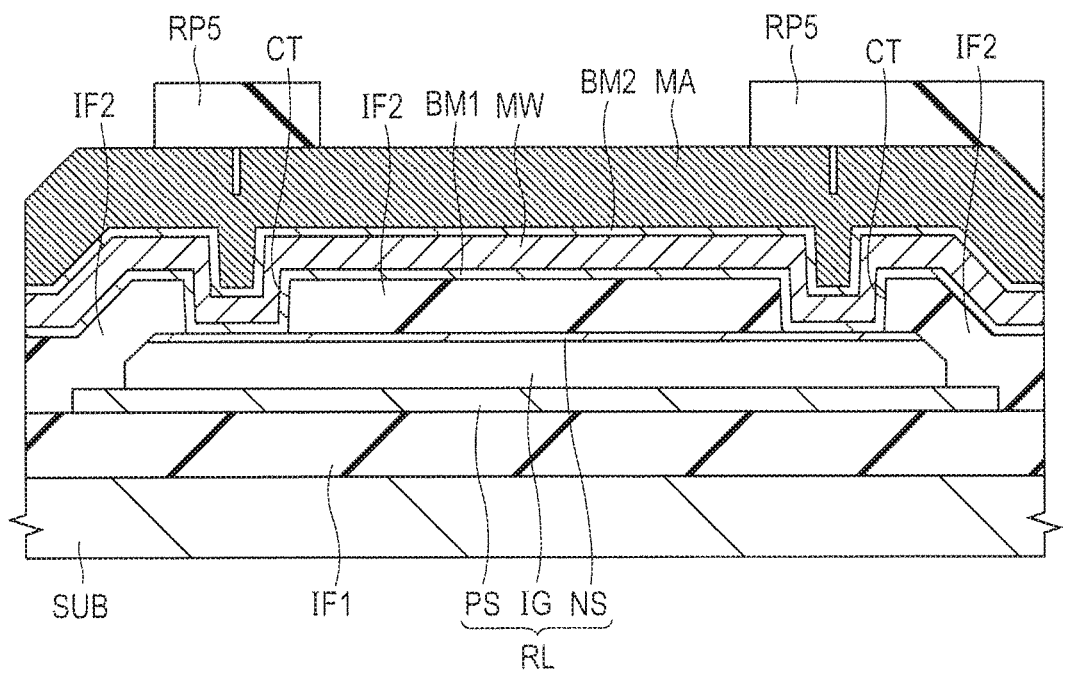
FIG. 26 is a fragmentary cross-sectional view of the germanium photoreceiver during a manufacturing step following that of FIG. 25.

Next, as shown in FIG. 26, a resist film is applied onto the aluminum film MA. After exposure, development treatment is performed to pattern the resist film into a resist pattern RP5. The resist pattern RP5 is present in a region where a first-layer wiring M1 is to be formed.

Figure 27:
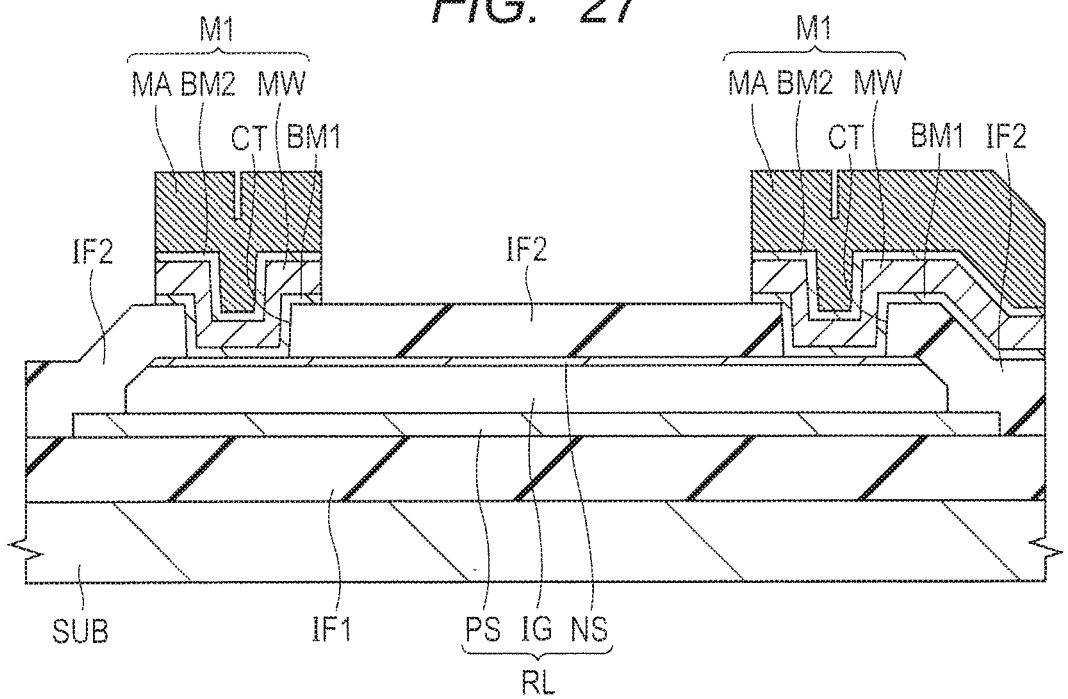
FIG. 27 is a fragmentary cross-sectional view of the germanium photoreceiver during a manufacturing step following that of FIG. 26.

Next, as shown in FIG. 27, the aluminum film MA, the second barrier metal film BM2, the tungsten film MW, and the first barrier metal film BM1 are processed successively by dry etching to form a first-layer wiring M1 having a stacked structure with the tungsten film MW as a lower layer and the aluminum film MA as an upper layer.

Next, the resist pattern RP5 is removed and a protective film TC is formed so as to expose a portion of the upper surface of the first-layer wiring M1 (refer to FIG. 23). The protective film TC is made of, for example, a silicon oxide film.

As a result, a germanium photoreceiver PD4 of Fourth Embodiment having a pin structure comprised of the p type silicon core layer PS, the i type germanium layer IG, and the n type silicon layer NS is substantially completed.

Thus, according to Fourth Embodiment, the first-layer wiring M1 to be electrically coupled to the photoreceiving portion RL having the i type germanium layer IG as a constituent material has a stacked structure of the tungsten film MW and the aluminum film MA so that the germanium photoreceiver PD4 thus obtained can have high reliability, hardly affected by the thermal stress in the post step.

The first-layer wiring M1 comprised only of the tungsten film MW may have an increased wiring resistance, but the first-layer wiring M1 having the aluminum film MA on the tungsten film MW can have a reduced wiring resistance.

(Fifth Embodiment)
<Structure of Semiconductor Device>

Figure 28:
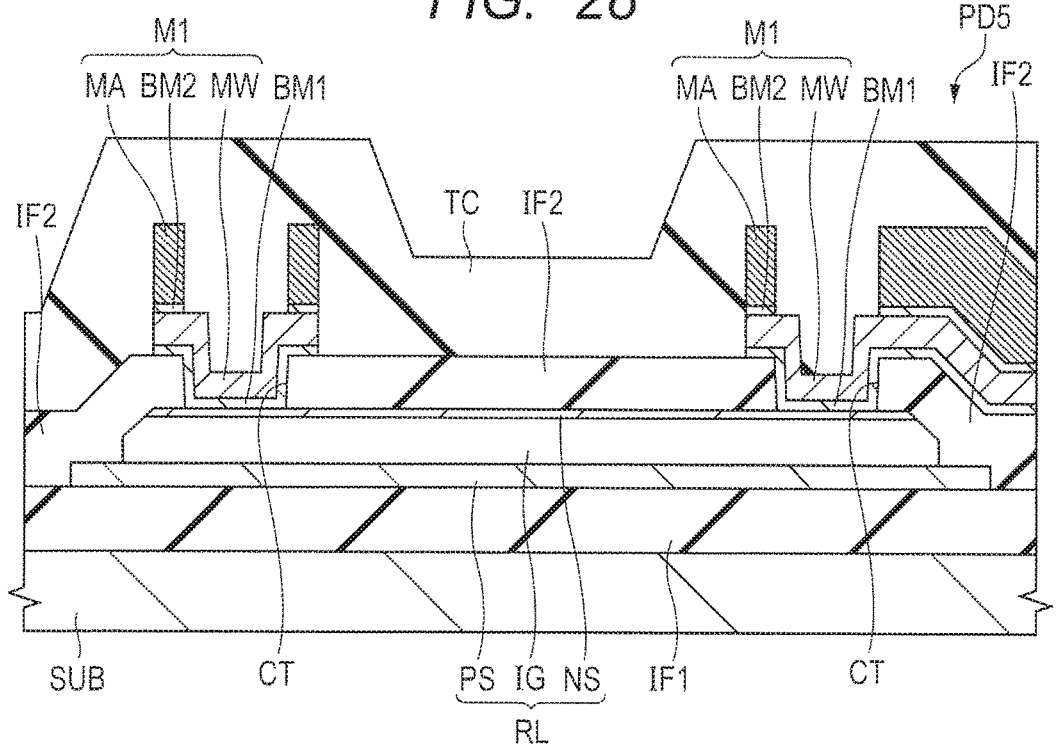
FIG. 28 is a fragmentary cross-sectional view of a germanium photoreceiver of Fifth Embodiment.

The structure of a germanium photoreceiver of Fifth Embodiment will be described referring to FIG. 28. FIG. 28 is a fragmentary cross-sectional view of the germanium photoreceiver of Fifth Embodiment.

As shown in FIG. 28, the germanium photoreceiver PD5 of Fifth Embodiment is different from the above-described germanium photoreceiver PD1 of First Embodiment in a conductive material configuring the first-layer wiring M1.

Described specifically, the conductive material configuring the first-layer wiring M1 in the germanium photoreceiver PD1 of First Embodiment is the tungsten film MW, while the conductive material configuring the first-layer wiring M1 in the germanium photoreceiver PD5 of Fifth Embodiment is, similar to that of Fourth Embodiment, a stacked film of the tungsten film MW and an aluminum film MA. Different from Fourth Embodiment, however, the contact hole CT does not have therein the aluminum film MA.

The germanium photoreceiver PD5 of Fifth Embodiment uses, as the conductive material of the first-wiring layer M1 to be electrically coupled to the photoreceiving portion RL, the stacked film having the tungsten film MW as a lower layer and the aluminum film MA as an upper layer. Even application of a thermal stress to the tungsten film, for example, at from 350° C. to 400° C. for from about 30 minutes to 2 hours hardly causes diffusion of tungsten from the tungsten film MW into the i type germanium layer IG configuring the photoreceiving portion RL. Further, the tungsten film MW and the photoreceiving portion RL have therebetween a first barrier metal film BM1 which prevents diffusion of tungsten.

The contact hole CT does not have therein the aluminum film MA. The photoreceiving portion RL and the aluminum film MA positioned above the upper surface of the photoreceiving portion RL have therebetween the second insulating film IF2, the first barrier metal film, the tungsten film MW, and the second barrier metal film. Even application of the thermal stress therefore hardly causes diffusion of aluminum from the aluminum film MA into the i type germanium layer IG configuring the photoreceiving portion RL.

Therefore, a reaction between germanium and tungsten or aluminum hardly occurs, making it possible to prevent the resulting germanium photoreceiver PD5 from having diode characteristics deteriorated by the above-described thermal stress.

Further, in general, a tungsten film has a resistance higher than that of an aluminum film or a copper film but in the germanium photoreceiver PD5 of Fifth Embodiment, the first-layer wiring M1 can have a reduced resistance because the aluminum film MA is formed on the tungsten film MW. The first barrier metal film BM1, the tungsten film MW, and the second barrier metal film BM2 have thicknesses of, for example, 10 nm, 50 nm, and 10 nm, respectively.

<Method of Manufacturing the Semiconductor Device>

A method of manufacturing the germanium photoreceiver of Fifth Embodiment will be described in order of steps referring to FIGS. 29 to 32. FIGS. 29 to 32 are fragmentary cross-sectional views of the germanium photoreceiver of Fifth Embodiment during manufacturing steps thereof.

Figure 29:
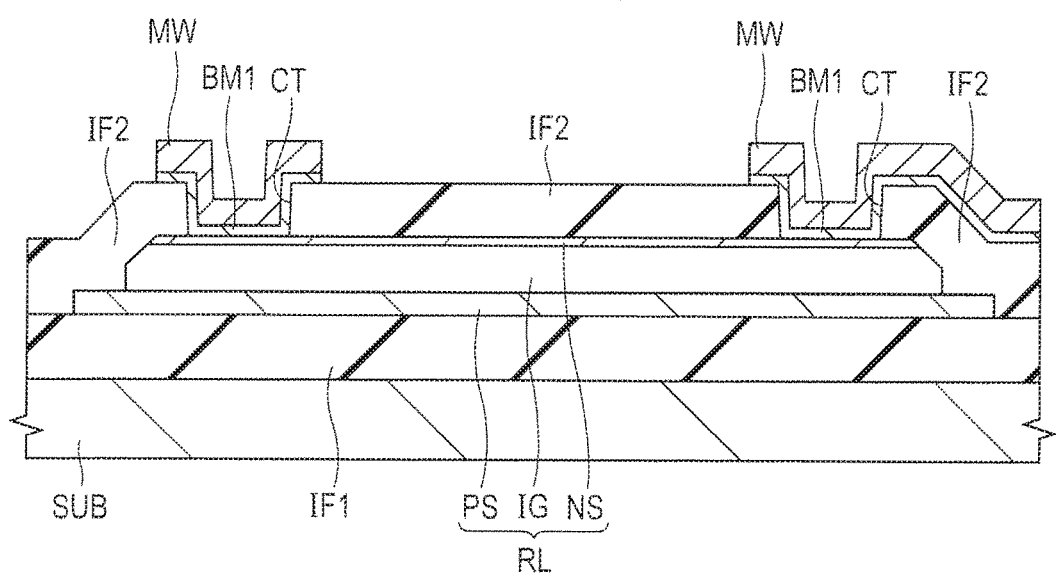
FIG. 29 is a fragmentary cross-sectional view showing a manufacturing step of the germanium photoreceiver of Fifth Embodiment.

As shown in FIG. 29, similar to First Embodiment, a photoreceiving portion RL having a vertical pin structure comprised of a p type silicon core layer PS, an i type germanium layer IG, and an n type silicon layer NS is formed on the main surface of a semiconductor substrate SUB via a first insulating film IF1 (refer to FIG. 2). Then, a second insulating film IF2 formed on the first insulating film IF1 so as to cover the photoreceiving portion RL is processed to form a coupling hole CT reaching the photoreceiving portion RL (refer to FIGS. 3 to 5).

Further, a tungsten film MW is formed which configures the lower portion of the first-layer wiring M1 and is electrically coupled to the photoreceiving portion RL via the coupling hole CT (refer to FIGS. 6 to 9).

The tungsten film MW and the photoreceiving portion RL have therebetween a first barrier metal film BM1. The first barrier metal film BM1 is made of, for example, a titanium film, a tantalum film, a titanium nitride film, or a tantalum nitride film. Alternatively, the first barrier metal film BM1 is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The first barrier metal film BM1 has a thickness of, for example, from about 10 nm to 300 nm.

Figure 30:
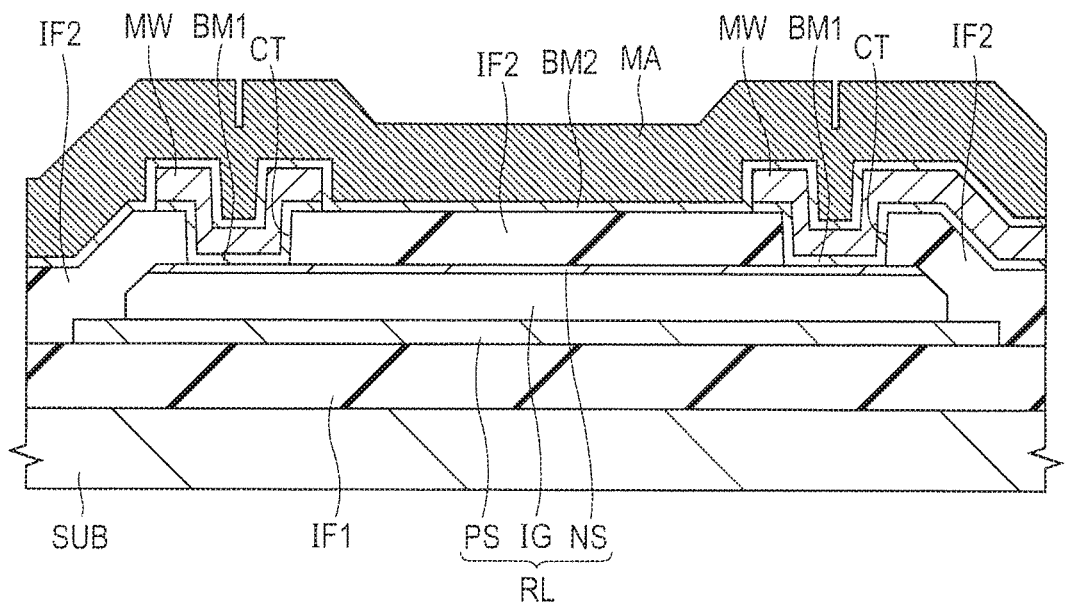
FIG. 30 is a fragmentary cross-sectional view of the germanium photoreceiver during a manufacturing step following that of FIG. 29.

Next, as shown in FIG. 30, a second barrier metal film BM2 is formed on the second insulating film IF2, for example, by sputtering so as to cover the tungsten film MW therewith. The second barrier metal film BM2 is made of, for example, a titanium film, a tantalum film, a titanium nitride film, or a tantalum nitride film. Alternatively, the second barrier metal film BM2 is made of, for example, a Ti/Ta stacked film having a titanium film as a lower layer and a tantalum film as an upper layer, a Ta/Ti stacked film having a tantalum film as a lower layer and a titanium film as an upper layer, a Ti/TiN stacked film having a titanium film as a lower layer and a titanium nitride film as an upper layer, or a Ta/TaN stacked film having a tantalum film as a lower layer and a tantalum nitride film as an upper layer. The second barrier metal film BM2 has a thickness of, for example, from about 10 nm to 300 nm.

Next, an aluminum film MA is formed on the second barrier metal film BM2, for example, by sputtering.

Figure 31:
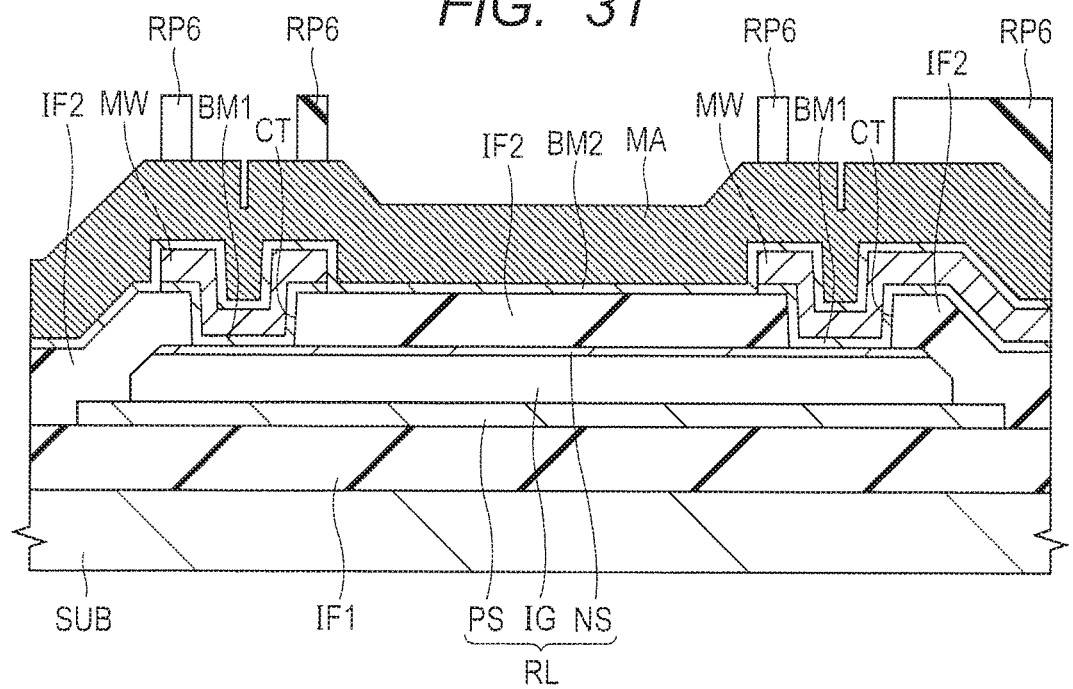
FIG. 31 is a fragmentary cross-sectional view of the germanium photoreceiver during a manufacturing step following that of FIG. 30.

Next, as shown in FIG. 31, a resist film is applied onto the aluminum film MA. After exposure, development treatment is performed to pattern the resist film into a resist pattern RP6. The resist pattern RP6 is present in a region where an upper portion of the first-layer wiring M1 is to be formed.

Figure 32:
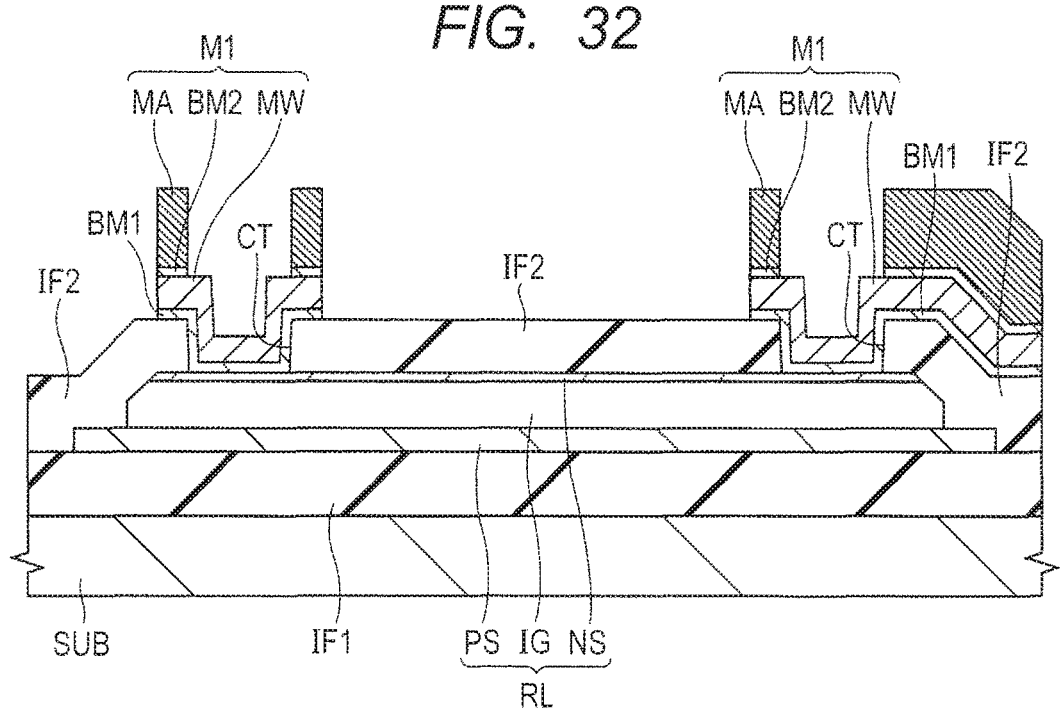
FIG. 32 is a fragmentary cross-sectional view of the germanium photoreceiver during a manufacturing step following that of FIG. 31.

Next, as shown in FIG. 32, with the resist pattern RP6 as a mask, the aluminum film MA and the second barrier metal film BM2 are processed successively by dry etching to form a first-layer wiring M1 having a stacked structure having the tungsten film MW as a lower layer and the aluminum film MA as an upper layer. At this time, the aluminum film MA which has filled the coupling hole CDT is removed.

Then, the resist pattern RP6 is removed and a protective film TC is formed so as to expose a portion of the upper surface of the first-layer wiring M1 (refer to FIG. 28). The protective film TC is made of, for example, a silicon oxide film.

As a result, the germanium photoreceiver PDT of Fifth Embodiment having a pin structure comprised of the p type silicon core layer PS, the i type germanium layer IG, and the n type silicon layer NS is substantially completed.

Thus, according to Fifth Embodiment, the first-layer wiring M1 to be electrically coupled to the photoreceiving portion RL having the i type germanium layer IG as a constituent material has a stacked structure of the tungsten film MW and the aluminum film MA. In addition, the photoreceiving portion RL and the aluminum layer MA positioned above the upper surface of the photoreceiving portion RL have therebetween the second insulating film IF2, the first barrier metal film BM1, the tungsten film MW, and the second barrier metal film BM2 without having the aluminum film MA inside the coupling hole CT. The germanium photoreceiver PD5 can therefore have high reliability, hardly affected by the thermal stress in the post step.

Further, the first-layer wiring M1 comprised only of the tungsten film MW may have an increased wiring resistance, but the first-layer wiring M1 obtained by stacking the aluminum film MA on the tungsten film MW can have a reduced wiring resistance.

The invention made by the present inventors has been described specifically based on some embodiments. It is needless to say that the invention is not limited by these embodiments, but can be changed in various ways without departing from the gist of the invention.

What is claimed is:

1. A semiconductor device, comprising:
   a substrate having silicon;
   a first insulating film disposed on a main surface of the substrate;
   a photoreceiver portion disposed on the first insulating film and having a germanium layer;
   a second insulating film covering an upper surface of the photoreceiver portion, extending from the upper surface of the photoreceiver portion to the first insulating film to cover side surfaces of the photoreceiver portion, and having a coupling hole exposing a portion of the upper surface of the photoreceiver portion;
   a first barrier metal film disposed on an inner wall of the coupling hole; and
   a wiring disposed on the first barrier metal film,
   wherein the wiring has a tungsten film contiguous to the first barrier metal film, and
   wherein the photoreceiver portion includes a first conductivity type silicon layer, the germanium layer, and a second conductivity type silicon layer sequentially stacked on each other.

2. The semiconductor device according to claim 1, wherein the first barrier metal film is one of a titanium film, a tantalum film, a titanium nitride film, a tantalum nitride film, a Ti/Ta stacked film having a titanium film as a lower layer, and a tantalum film as an upper layer disposed on the lower layer.

3. The semiconductor device according to claim 1, wherein the wiring includes the tungsten film, a second barrier metal film disposed on the tungsten film, and a copper film disposed on the second barrier metal film.

4. The semiconductor device according to claim 3, wherein the coupling hole has therein the tungsten film but does not have the copper film.

5. The semiconductor device according to claim 3, wherein the second barrier metal film is a titanium film, a tantalum film, a titanium nitride film, a tantalum nitride film, a Ti/Ta stacked film having a titanium film as a lower layer and a tantalum film as an upper layer disposed on the lower layer, a Ta/Ti stacked film having a tantalum film as a lower layer and a titanium film as an upper layer disposed on the lower layer, a Ti/TiN stacked film having a titanium film as a lower layer and a titanium nitride film as an upper layer disposed on the lower layer, or a Ta/TaN stacked film having a tantalum film as a lower layer and a tantalum nitride film as an upper layer disposed on the lower layer.

6. The semiconductor device according to claim 1, wherein the wiring includes the tungsten film, a second barrier metal film disposed on the tungsten film, and an aluminum film disposed on the second barrier metal film.

7. The semiconductor device according to claim 6, wherein the coupling hole has therein the tungsten film but does not have the aluminum film.

8. The semiconductor device according to claim 6, wherein the second barrier metal film is a titanium film, a tantalum film, a titanium nitride film, a tantalum nitride film, a Ti/Ta stacked film having a titanium film as a lower layer and a tantalum film as an upper layer disposed on the lower layer, a Ta/Ti stacked film having a tantalum film as a lower layer and a titanium film as an upper layer disposed on the lower layer, a Ti/TiN stacked film having a titanium film as a lower layer and a titanium nitride film as an upper layer disposed on the lower layer, or a Ta/TaN stacked film having a tantalum film as a lower layer and a tantalum nitride film as an upper layer disposed on the lower layer.

9. The semiconductor device according to claim 1, wherein the first barrier metal film is a Ta/Ti stacked film having a tantalum film as a lower layer and a titanium film as an upper layer disposed on the lower layer.

10. The semiconductor device according to claim 1, wherein the first barrier metal film is a Ti/TiN stacked film having a titanium film as a lower layer and a titanium nitride film as an upper layer disposed on the lower layer.

11. The semiconductor device according to claim 1, wherein the first barrier metal film is a Ta/TaN stacked film having a tantalum film as a lower layer and a tantalum nitride film as an upper layer disposed on the lower layer.

12. The semiconductor device according to claim 1, wherein the second insulating film extends from the upper surface of the photoreceiver portion to contact the first insulating film and covers the entire side surfaces of the photoreceiver portion.

13. A semiconductor device, comprising:
a substrate having silicon;
a first insulating film disposed on a main surface of the substrate;
a photoreceiver portion disposed on the first insulating film and having a germanium layer;
a second insulating film disposed on the first insulating film, covering the photoreceiver portion, and having coupling holes respectively exposing edge portions of an upper surface of the photoreceiver portion;
first barrier metal films disposed on inner walls of the coupling holes, respectively; and
wirings disposed on the first barrier metal films, respectively,
wherein the wirings have tungsten films contiguous to the first barrier metal films, respectively, and
wherein the second insulating film is in physical contact with a center portion of the upper surface of the photoreceiver portion between the edge portions thereof.

14. The semiconductor device according to claim 13, wherein the second insulating film extends from the upper surface of the photoreceiver portion to contact the first insulating film and covers entire side surfaces of the photoreceiver portion.

15. The semiconductor device according to claim 13, wherein the first barrier metal films extend from the inner walls of the coupling holes to portions of an upper surface of the second insulating film, respectively and
wherein the wirings are disposed in the coupling holes and extend onto portions of the first barrier metal films that cover the portions of the upper surface of the second insulating film, respectively.

16. The semiconductor device according to claim 13, wherein the photoreceiver portion includes a first conductivity type silicon layer, the germanium layer disposed on the silicon layer, and a silicon layer, a germanium layer, or a silicon-germanium layer having a second conductivity type different from the first conductivity type disposed on the germanium layer.

17. A semiconductor device, comprising:
a substrate having silicon;
a first insulating film disposed on a main surface of the substrate;
a photoreceiver portion disposed on the first insulating film and having a germanium layer;
a second insulating film disposed on the first insulating film, covering the photoreceiver portion, and having a coupling hole exposing a portion of an upper surface of the photoreceiver portion;
a first barrier metal film disposed on an inner wall of the coupling hole and extending from the inner wall of the coupling hole to a portion of an upper surface of the second insulating film; and
a wiring disposed in the coupling hole and extending onto a portion of the first barrier metal film that covers the portion of the upper surface of the second insulating film,
wherein the wiring has a tungsten film contiguous to the first barrier metal film.

18. The semiconductor device according to claim 17, wherein the photoreceiver portion includes a first conductivity type silicon layer, the germanium layer disposed on the silicon layer, and a silicon layer, a germanium layer, or a silicon-germanium layer having a second conductivity type different from the first conductivity type disposed on the germanium layer.

* * * * *